(12) United States Patent
Tanaka et al.

(10) Patent No.: US 12,194,570 B2
(45) Date of Patent: Jan. 14, 2025

(54) LASER PROCESSING METHOD, SEMICONDUCTOR MEMBER MANUFACTURING METHOD, AND LASER PROCESSING DEVICE

(71) Applicants: National University Corporation Tokai National Higher Education and Research System, Nagoya (JP); HAMAMATSU PHOTONICS K.K., Hamamatsu (JP)

(72) Inventors: Atsushi Tanaka, Nagoya (JP); Chiaki Sasaoka, Nagoya (JP); Hiroshi Amano, Nagoya (JP); Daisuke Kawaguchi, Hamamatsu (JP); Yotaro Wani, Hamamatsu (JP); Yasunori Igasaki, Hamamatsu (JP)

(73) Assignees: National University Corporation Tokai National Higher Education and Research System, Nagoya (JP); HAMAMATSU PHOTONICS K.K., Hamamatsu (JP)

( * ) Notice: Subject to any disclaimer, the term of this patent is extended or adjusted under 35 U.S.C. 154(b) by 261 days.

(21) Appl. No.: 17/414,428

(22) PCT Filed: Dec. 18, 2019

(86) PCT No.: PCT/JP2019/049700
§ 371 (c)(1),
(2) Date: Jun. 16, 2021

(87) PCT Pub. No.: WO2020/130054
PCT Pub. Date: Jun. 25, 2020

(65) Prior Publication Data
US 2022/0093463 A1     Mar. 24, 2022

(30) Foreign Application Priority Data

Dec. 21, 2018   (JP) ................................ 2018-239883

(51) Int. Cl.
    *B23K 26/53*            (2014.01)
    *B28D 5/00*             (2006.01)
    (Continued)

(52) U.S. Cl.
    CPC ............ *B23K 26/53* (2015.10); *B28D 5/0011* (2013.01); *H01L 21/304* (2013.01); *H01L 21/67115* (2013.01); *H01L 21/78* (2013.01)

(58) Field of Classification Search
CPC ................ B23K 26/53; B23K 26/0853; B23K 2101/40; B23K 2103/56; B23K 26/0006;
(Continued)

(56) References Cited

U.S. PATENT DOCUMENTS

| 9,653,644 | B2 | 5/2017 | Tamemoto et al. | |
| 2007/0111481 | A1* | 5/2007 | Tamura | B23K 26/40 257/797 |

(Continued)

FOREIGN PATENT DOCUMENTS

| CN | 1967816 A | 5/2007 |
| CN | 101110392 A | 1/2008 |

(Continued)

OTHER PUBLICATIONS

International Preliminary Report on Patentability mailed Jul. 1, 2021 for PCT/JP2019/049700.

(Continued)

*Primary Examiner* — Thanh T Nguyen
(74) *Attorney, Agent, or Firm* — Faegre Drinker Biddle & Reath LLP

(57) ABSTRACT

There is provided a laser processing method for cutting a semiconductor object along a virtual plane facing a surface of the semiconductor object in the semiconductor object. The laser processing method includes a first step of forming a plurality of first modified spots along the virtual plane by (Continued)

causing laser light to enter into the semiconductor object from the surface, and a second step of forming a plurality of second modified spots along the virtual plane so as not to overlap the plurality of first modified spots, by causing laser light to enter into the semiconductor object from the surface.

12 Claims, 34 Drawing Sheets

(51) Int. Cl.
  *H01L 21/304* (2006.01)
  *H01L 21/67* (2006.01)
  *H01L 21/78* (2006.01)
(58) Field of Classification Search
  CPC ............ B23K 26/0624; B23K 26/0823; B23K 26/0622; B23K 26/38; B28D 5/0011; B28D 5/04; H01L 21/304; H01L 21/67115; H01L 21/78; H01L 21/67092
  See application file for complete search history.

(56) References Cited

U.S. PATENT DOCUMENTS

| | | |
|---|---|---|
| 2007/0252154 A1 | 11/2007 | Uchiyama et al. |
| 2013/0316517 A1 | 11/2013 | Fujii et al. |
| 2018/0294189 A1 | 10/2018 | Ogiwara et al. |
| 2019/0304839 A1 | 10/2019 | Ogiwara et al. |

FOREIGN PATENT DOCUMENTS

| | | | |
|---|---|---|---|
| CN | 103025471 A | | 4/2013 |
| CN | 103521934 A | | 1/2014 |
| CN | 105750742 A | | 7/2016 |
| CN | 107464778 A | | 12/2017 |
| JP | 2004-259846 A | | 9/2004 |
| JP | 2015-123466 A | | 7/2015 |
| JP | 2016-111149 A | | 6/2016 |
| JP | 2017-057103 A | | 3/2017 |
| JP | 2017-069510 A | | 4/2017 |
| JP | 2017-183600 A | | 10/2017 |
| JP | 2017-188586 A | | 10/2017 |
| JP | 2018-050066 A | | 3/2018 |
| JP | 2018-142702 A | | 9/2018 |
| KR | 10-2008-0003736 A | | 1/2008 |
| KR | 10-2008-0080085 A | | 9/2008 |
| KR | 10-2017-0114937 A | | 10/2017 |
| KR | 10-2018-0057692 A | | 5/2018 |
| TW | 201743372 A | | 12/2017 |
| WO | WO-2007/074823 A1 | | 7/2007 |
| WO | WO-2013/039162 A1 | | 3/2013 |
| WO | WO-2016/113030 A2 | | 7/2016 |
| WO | WO-2017/199784 A1 | | 11/2017 |
| WO | WO2007199784 | * | 11/2017 ........... H01L 21/304 |

OTHER PUBLICATIONS

International Preliminary Report on Patentability mailed Jul. 1, 2021 for PCT/JP2019/049701.

U.S. Final Office Action issued Sep. 4, 2024 in U.S. Appl. No. 17/414,668.

\* cited by examiner

Fig.4
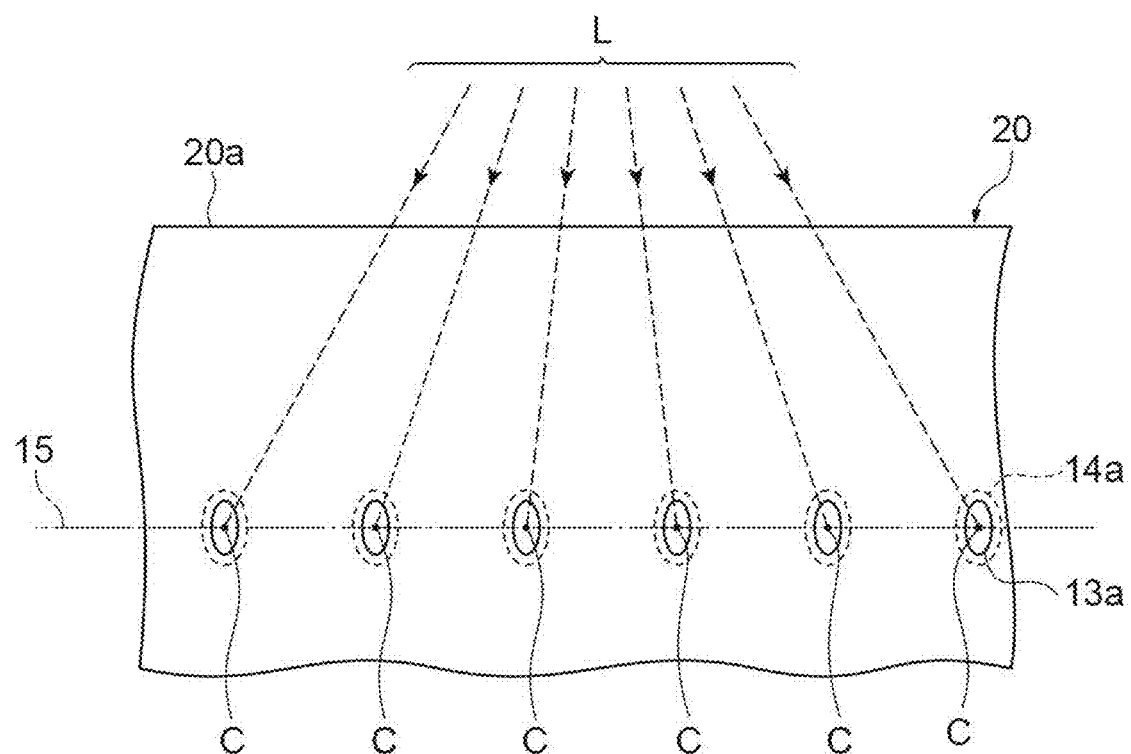
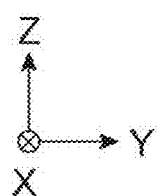

*Fig.10*
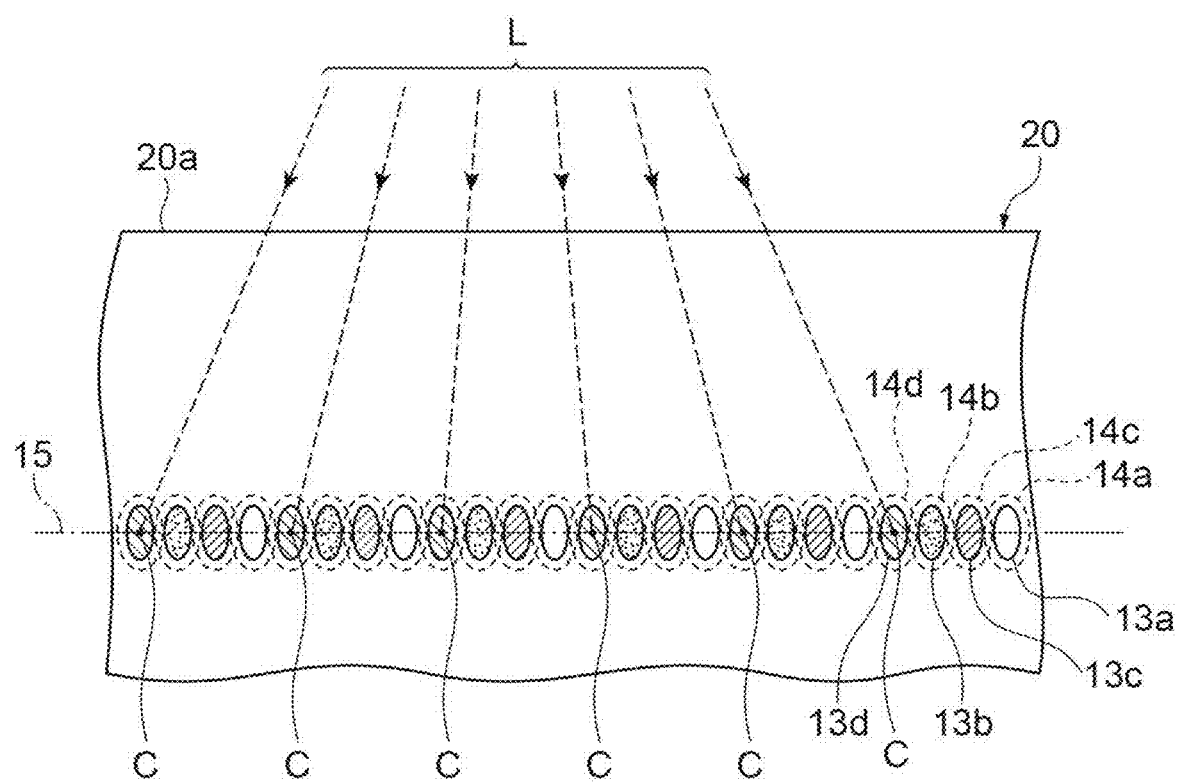
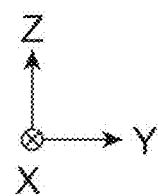

Fig.29
(a) 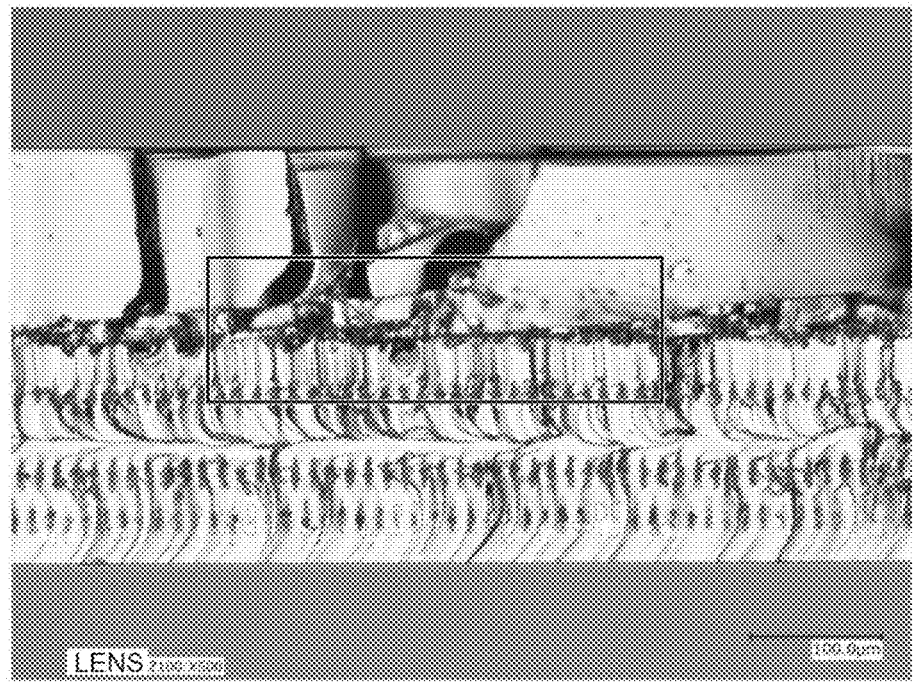
(b) 

LASER PROCESSING METHOD, SEMICONDUCTOR MEMBER MANUFACTURING METHOD, AND LASER PROCESSING DEVICE

TECHNICAL FIELD

The present disclosure relates to a laser processing method, a semiconductor member manufacturing method, and a laser processing apparatus.

BACKGROUND ART

There is known a processing method of cutting out a semiconductor member such as a semiconductor wafer from a semiconductor object in a manner of irradiating a semiconductor object such as a semiconductor ingot with laser light to form a modified region in the semiconductor object and to develop a fracture extending from the modified region (see Patent Literatures 1 and 2, for example).

CITATION LIST

Patent Literature

Patent Literature 1: Japanese Unexamined Patent Publication No. 2017-183600
Patent Literature 2: Japanese Unexamined Patent Publication No. 2017-057103

SUMMARY OF INVENTION

Technical Problem

In the processing method as described above, the manner of forming the modified region has a great influence on the state of the obtained semiconductor member.

An object of the present disclosure is to provide a laser processing method, a semiconductor member manufacturing method, and a laser processing apparatus capable of acquiring a suitable semiconductor member.

Solution to Problem

According to an aspect of the present disclosure, there is provided a laser processing method for cutting a semiconductor object along a virtual plane facing a surface of the semiconductor object in the semiconductor object. The laser processing method includes a first step of forming a plurality of first modified spots along the virtual plane by causing laser light to enter into the semiconductor object from the surface, and a second step of forming a plurality of second modified spots along the virtual plane so as not to overlap the plurality of first modified spots, by causing laser light to enter into the semiconductor object from the surface.

In the laser processing method, the plurality of first modified spots are formed along the virtual plane, and the plurality of second modified spots are formed along the virtual plane so as not to overlap the plurality of first modified spots. Thus, it is possible to form a plurality of first modified spots and a plurality of second modified spots along a virtual plane with high precision. As a result, it is possible to form a fracture crossing over the virtual plane, along the virtual plane with high precision. Thus, according to the laser processing method, it is possible to acquire a suitable semiconductor member by acquiring the semiconductor member from the semiconductor object with a fracture crossing over the virtual plane as a boundary.

In the laser processing method in the aspect of the present disclosure, in the second step, the plurality of second modified spots may be formed along the virtual plane so as not to overlap a plurality of fractures respectively extending from the plurality of first modified spots. According to this configuration, it is possible to form the plurality of first modified spots and the plurality of second modified spots along the virtual plane with higher precision. As a result, it is possible to form the fracture crossing over the virtual plane, along the virtual plane with higher precision.

In the laser processing method in the aspect of the present disclosure, in the second step, after the plurality of second modified spots are formed, a plurality of third modified spots are formed along the virtual plane so as not to overlap the plurality of first modified spots and the plurality of second modified spots, by causing laser light to enter into the semiconductor object from the surface. According to this configuration, it is possible to form the fracture crossing over the virtual plane, along the virtual plane with higher precision.

In the laser processing method in the aspect of the present disclosure, in the first step, the plurality of first modified spots may be formed so that a plurality of fractures respectively extending from the plurality of first modified spots are not connected to each other. According to this configuration, it is possible to form the plurality of second modified spots along the virtual plane with higher precision.

In the laser processing method in the aspect of the present disclosure, in the first step, a plurality of rows of first modified spots may be formed as the plurality of first modified spots by moving a converging point of the laser light pulse-oscillated along the virtual plane. In the second step, a plurality of rows of second modified spots may be formed as the plurality of second modified spots by moving a converging point of the laser light pulse-oscillated along the virtual plane between the rows of the plurality of rows of first modified spots. According to this configuration, it is possible to reliably prevent the plurality of second modified spots from overlapping the plurality of first modified spots and the plurality of fractures respectively extending from the plurality of first modified spots, and to form the plurality of second modified spots along the virtual plane with higher precision.

In the laser processing method in the aspect of the present disclosure, a material of the semiconductor object may contain gallium. In this case, if gallium is deposited on the plurality of fractures respectively extending from the plurality of first modified spots by irradiation with laser light, the laser light is easily absorbed by the gallium. Therefore, forming the plurality of second modified spots so as not to overlap the fractures is effective in forming the plurality of second modified spots along the virtual plane with high precision.

In the laser processing method in the aspect of the present disclosure, the material of the semiconductor object may contain gallium nitride. In this case, if gallium nitride is decomposed by the irradiation with laser light, gallium is deposited on the plurality of fractures respectively extending from the plurality of first modified spots, and the laser light is easily absorbed by the gallium. Therefore, forming the plurality of second modified spots so as not to overlap the fractures is effective in forming the plurality of second modified spots along the virtual plane with high precision. Further, if gallium nitride is decomposed by irradiation with laser light, a nitrogen gas is generated in the plurality of fractures. Therefore, it is possible to easily form the fracture crossing over the virtual plane by using pressure (internal pressure) of the nitrogen gas.

According to another aspect of the present disclosure, a semiconductor member manufacturing method includes the first step and the second step included in the laser processing method described above, and a third step of acquiring a semiconductor member from the semiconductor object by using the fracture crossing over the virtual plane, as a boundary.

According to the semiconductor member manufacturing method, with the first step and the second step, it is possible to form the fracture crossing over the virtual plane with high precision. Thus, it is possible to acquire a suitable semiconductor member.

In the semiconductor member manufacturing method in the aspect of the present disclosure, a plurality of the virtual planes may be set to be arranged in a direction facing the surface. According to this configuration, it is possible to acquire a plurality of the semiconductor members from one semiconductor object.

In the semiconductor member manufacturing method in the aspect of the present disclosure, the semiconductor object may be a semiconductor ingot, and the semiconductor member may be a semiconductor wafer. According to this configuration, it is possible to acquire a plurality of suitable semiconductor wafers.

In the semiconductor member manufacturing method in the aspect of the present disclosure, a plurality of the virtual planes may be set to be arranged in a direction in which the surface extends. According to this configuration, it is possible to acquire a plurality of the semiconductor members from one semiconductor object.

In the semiconductor member manufacturing method in the aspect of the present disclosure, the semiconductor object may be a semiconductor wafer, and the semiconductor member may be a semiconductor device. According to this configuration, it is possible to acquire a plurality of suitable semiconductor devices.

According to still another aspect, there is provided a laser processing apparatus for cutting a semiconductor object along a virtual plane facing a surface of the semiconductor object in the semiconductor object. The laser processing apparatus includes a stage configured to support the semiconductor object, and a laser irradiation unit configured to form a plurality of first modified spots and a plurality of second modified spots along the virtual plane by causing laser light to enter into the semiconductor object from the surface. The laser irradiation unit forms the plurality of first modified spots along the virtual plane, and forms the plurality of second modified spots along the virtual plane so as not to overlap the plurality of first modified spots, after forming the plurality of first modified spots.

According to the laser processing apparatus, it is possible to form the fracture crossing over the virtual plane, along the virtual plane with high precision. Thus, it is possible to acquire a suitable semiconductor member.

Advantageous Effects of Invention

According to the present disclosure, it is possible to provide a laser processing method, a semiconductor member manufacturing method, and a laser processing apparatus capable of acquiring a suitable semiconductor member.

BRIEF DESCRIPTION OF DRAWINGS

FIG. 4 is a longitudinal sectional view of a portion of the GaN ingot in one step of the laser processing method and the semiconductor member manufacturing method in the first embodiment.

FIG. 10 is a longitudinal sectional view of the portion of the GaN ingot in one step of the laser processing method and the semiconductor member manufacturing method in the first embodiment.

FIG. 29 shows an image of a fracture of a SiC wafer formed by a laser processing method and a semiconductor member manufacturing method in a comparative example.

DESCRIPTION OF EMBODIMENTS

Hereinafter, embodiments of the present disclosure will be described in detail with reference to the drawings. The same or corresponding parts in the respective drawings are denoted with the same reference signs, and repetitive descriptions will be omitted.

[Configuration of Laser Processing Device]

Figure 1:
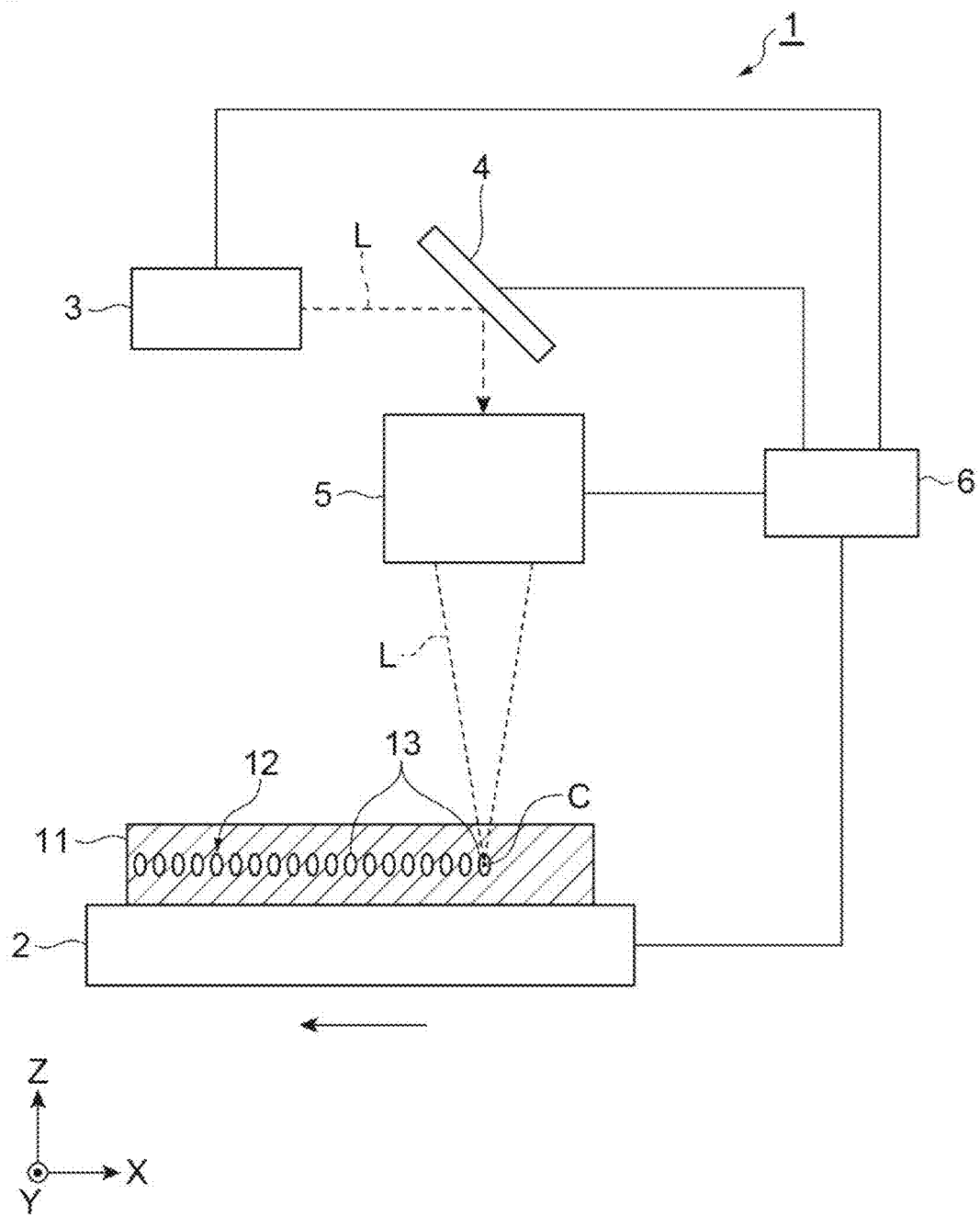
FIG. 1 is a configuration diagram illustrating a laser processing apparatus according to an embodiment.

As illustrated in FIG. 1, a laser processing apparatus 1 includes a stage 2, a light source 3, a spatial light modulator 4, a converging lens 5, and a control unit 6. The laser processing apparatus 1 is a device that forms a modified region 12 on an object 11 by irradiating the object 11 with laser light L. A first horizontal direction is referred to as an X direction below, and a second horizontal direction perpendicular to the first horizontal direction is referred to as a Y direction below. The vertical direction is referred to as a Z direction.

The stage 2 supports the object 11 by, for example, adsorbing a film attached to the object 11. In the present embodiment, the stage 2 is movable along each of the X direction and the Y direction. The stage 2 is rotatable about an axis parallel to the Z direction.

The light source 3 outputs the laser light L having transparency to the object 11, for example, by a pulse oscillation method. The spatial light modulator 4 modulates the laser light L output from the light source 3. The spatial light modulator 4 is, for example, a spatial light modulator (SLM) of a reflective liquid crystal (LCOS: Liquid Crystal on Silicon). The converging lens 5 converges the laser light L modulated by the spatial light modulator 4. In the present embodiment, the spatial light modulator 4 and the converging lens 5 are movable along the Z direction as a laser irradiation unit.

If the laser light L is converged in the object 11 supported by the stage 2, the laser light L is particularly absorbed at a portion corresponding to a converging point C of the laser light L, and thus the modified region 12 is formed in the object 11. The modified region 12 is a region in which the density, the refractive index, the mechanical strength, and other physical properties are different from those of the surrounding non-modified region. Examples of the modified region 12 include a melting treatment region, a fracture region, a dielectric breakdown region, and a refractive index change region.

As an example, if the stage 2 is moved along the X-direction and the converging point C is moved relative to the object 11 along the X-direction, a plurality of modified spots 13 are formed to be arranged in one row along the X-direction. One modified spot 13 is formed by irradiation with the laser light L of one pulse. The modified region 12 in one row is a set of a plurality of modified spots 13 arranged in one row. Adjacent modified spots 13 may be connected to each other or separated from each other, depending on the relative movement speed of the converging point C with respect to the object 11 and the repetition frequency of the laser light L.

The control unit 6 controls the stage 2, the light source 3, the spatial light modulator 4, and the converging lens 5. The control unit 6 is configured as a computer device including a processor, a memory, a storage, a communication device, and the like. In the control unit 6, software (program) read into the memory or the like is executed by the processor, and thus reading and writing of data in the memory and the storage and communication by a communication device are controlled by the processor. Thus, the control unit 6 realizes various functions.

[Laser Processing Method and Semiconductor Member Manufacturing Method in First Embodiment]

Figure 2:
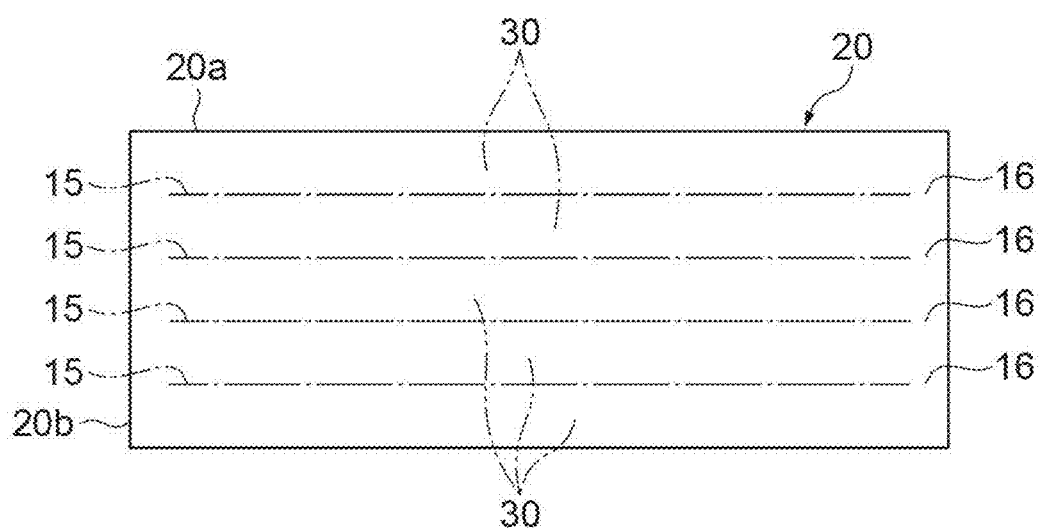
FIG. 2 is a side view illustrating a GaN ingot which is an object of a laser processing method and a semiconductor member manufacturing method according to a first embodiment.
Figure 3:
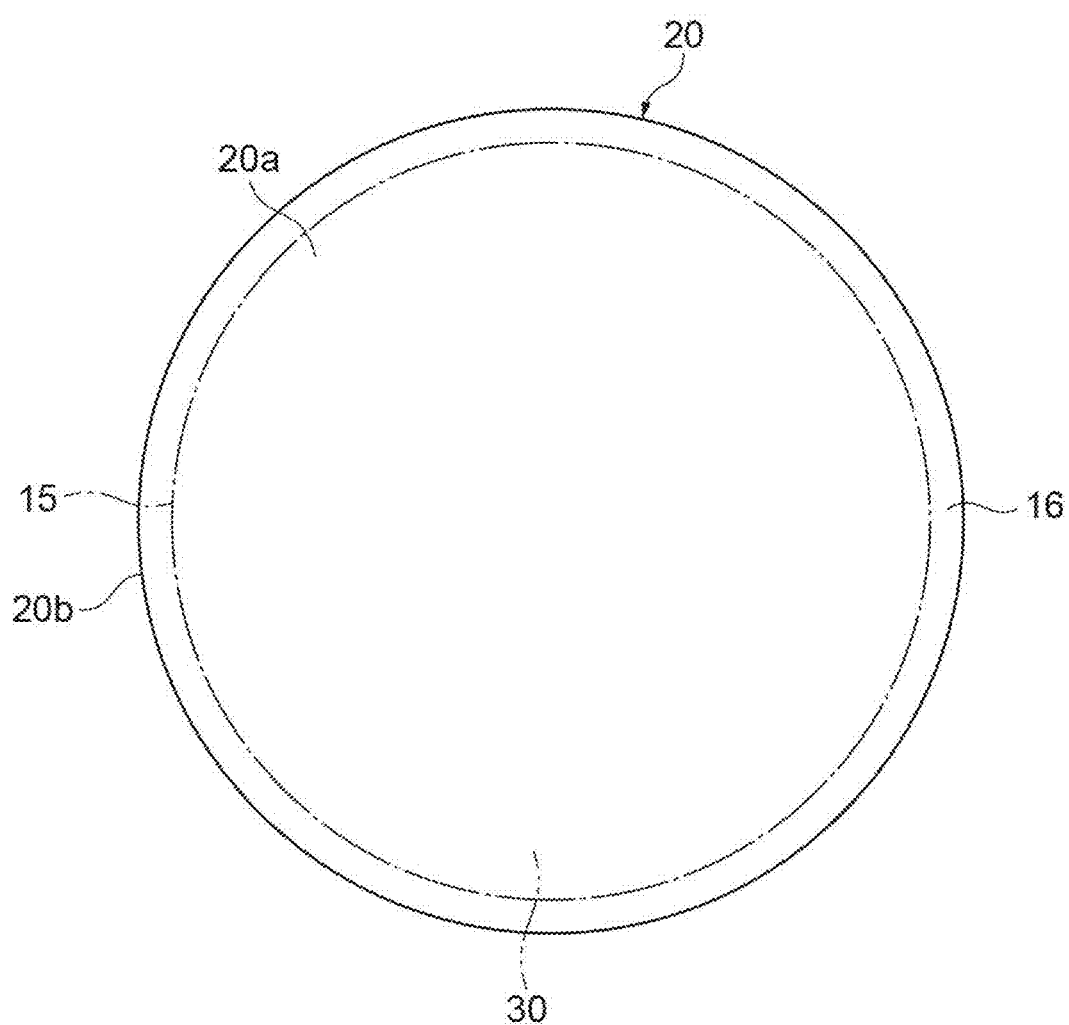
FIG. 3 is a plan view illustrating the GaN ingot illustrated in FIG. 2.

As illustrated in FIGS. 2 and 3, an object 11 of a laser processing method and a semiconductor member manufacturing method according to a first embodiment is a GaN ingot (semiconductor ingot, semiconductor object) 20 formed of gallium nitride (GaN) in, for example, a disc shape. As an example, the diameter of the GaN ingot 20 is 2 in and the thickness of the GaN ingot 20 is 2 mm. The laser processing method and the semiconductor member manufacturing method in the first embodiment are performed to cut out a plurality of GaN wafers (semiconductor wafer, semiconductor member) 30 from the GaN ingot 20. As an example, the diameter of the GaN wafer 30 is 2 in and the thickness of the GaN wafer 30 is 100 μm.

Firstly, the laser processing apparatus 1 described above forms a plurality of modified spots 13 along each of a plurality of virtual planes 15. Each of the plurality of virtual planes 15 is a plane facing the surface 20a of the GaN ingot 20 in the GaN ingot 20, and is set to be arranged in a direction facing the surface 20a. In the present embodiment, each of the plurality of virtual planes 15 is a plane parallel to the surface 20a, and has, for example, a circular shape. The plurality of virtual planes 15 are set to overlap each other when viewed from the surface 20a side. In the GaN ingot 20, a plurality of peripheral edge regions 16 are set to surround the plurality of virtual planes 15, respectively. That is, each of the plurality of virtual planes 15 does not reach a side surface 20b of the GaN ingot 20. As an example, the distance between the adjacent virtual planes 15 is 100 μm, and the width (in the present embodiment, distance between the outer edge of the virtual plane 15 and the side surface 20b) of the peripheral edge region 16 is equal to or more than 30 μm.

The plurality of modified spots 13 are sequentially formed for each virtual plane 15 from an opposite side of the surface 20a, for example, by irradiation with laser light L having a wavelength of 532 nm. Since the plurality of modified spots 13 are formed in each of the plurality of virtual planes 15 in a similar manner, the formation of the plurality of modified spots 13 along the virtual plane 15 which is the closest to the surface 20a will be described below in detail with reference to FIGS. 4 to 11. In FIGS. 5, 7, 9, and 11, an arrow indicates the trajectory of the converging point C of the laser light L. In addition, modified spots 13a, 13b, 13c, and 13d described later may be collectively referred to as the modified spot 13, and fractures 14a, 14b, 14c, and 14d described later may be collectively referred to as a fracture 14.

Figure 5:
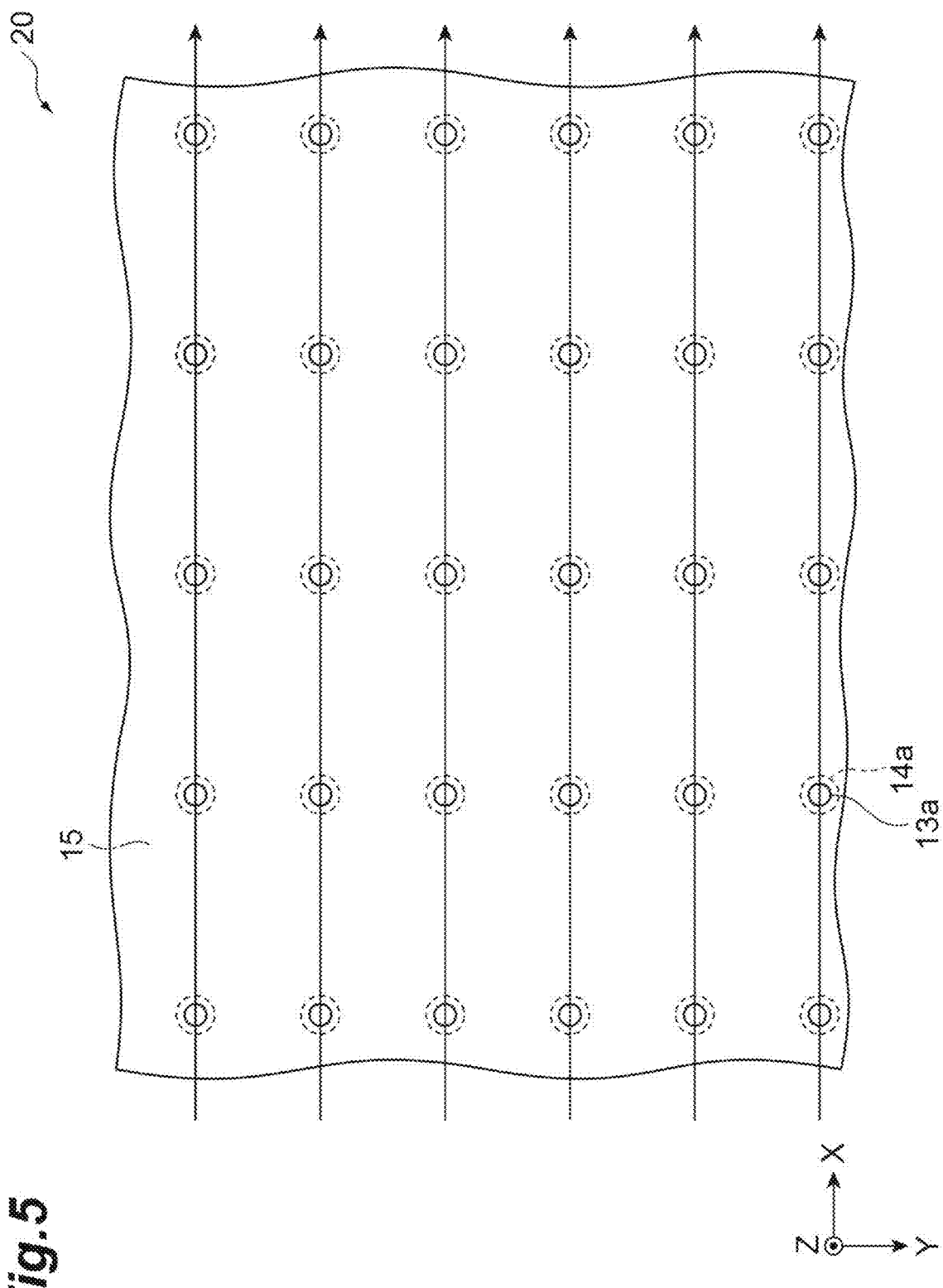
FIG. 5 is a cross-sectional view of the portion of the GaN ingot in one step of the laser processing method and the semiconductor member manufacturing method in the first embodiment.

Firstly, as illustrated in FIGS. 4 and 5, the laser processing apparatus 1 forms a plurality of modified spots (first modified spots) 13a along the virtual plane 15 (for example, so as to be two-dimensionally arranged along all virtual planes 15) by causing laser light L to enter into the GaN ingot 20 from the surface 20a (first step). At this time, the laser processing apparatus 1 forms the plurality of modified spots 13a so that the plurality of fractures 14a respectively extending from the plurality of modified spots 13a are not connected to each other. In addition, the laser processing apparatus 1 forms a plurality of rows of modified spots 13a by moving the converging point C of the laser light L pulse-oscillated along the virtual plane 15. In FIGS. 4 and 5, the modified spot 13a is indicated by a white outline (without hatching), and a range in which the fracture 14a extends is indicated by a broken line (this is similarly applied to FIGS. 6 to 11).

In the present embodiment, the laser light L pulse-oscillated is modulated by the spatial light modulator 4 so as to be converged at a plurality (for example, six) of converging points C arranged in the Y direction. The plurality of converging points C are relatively moved on the virtual plane 15 along the X direction. As an example, the distance between the converging points C adjacent to each other in the Y direction is 8 μm, and the pulse pitch (that is, value obtained by dividing the relative movement speed of the plurality of converging points C by the repetition frequency of the laser light L) of the laser light L is 10 μm. The pulse energy of the laser light L per converging point C (simply referred to as "pulse energy of the laser light L" below) is 0.33 μJ. In this case, the center-to-center distance between the modified spots 13a adjacent to each other in the Y direction is 8 μm, and the center-to-center distance between the modified spots 13a adjacent to each other in the X direction is 10 μm. The plurality of fractures 14a respectively extending from the plurality of modified spots 13a are not connected to each other.

Figure 6:
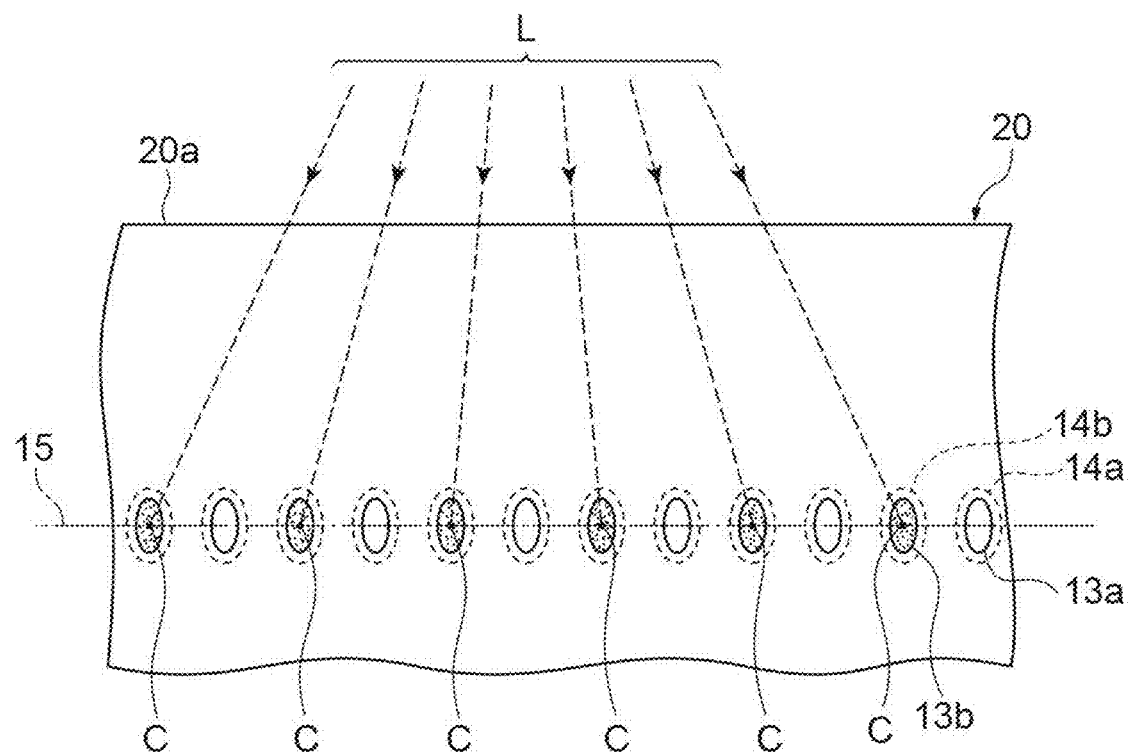
FIG. 6 is a longitudinal sectional view of the portion of the GaN ingot in one step of the laser processing method and the semiconductor member manufacturing method in the first embodiment.
Figure 7:
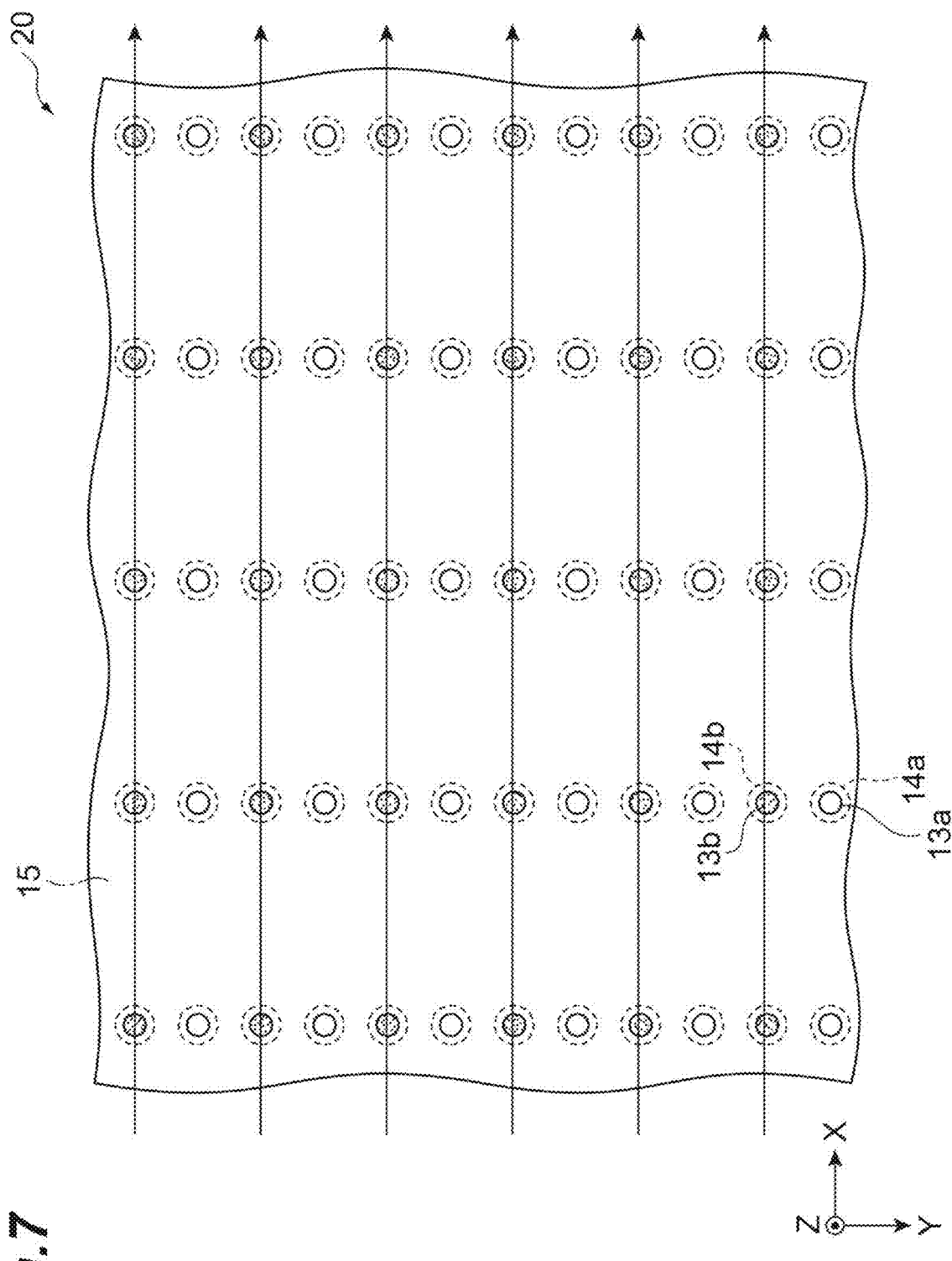
FIG. 7 is a cross-sectional view of the portion of the GaN ingot in one step of the laser processing method and the semiconductor member manufacturing method in the first embodiment.

As illustrated in FIGS. 6 and 7, the laser processing apparatus 1 forms a plurality of modified spots (second modified spots) 13b along the virtual plane 15 (for example, so as to be two-dimensionally arranged along all virtual planes 15) by causing laser light L to enter into the GaN ingot 20 from the surface 20a (second step). At this time, the laser processing apparatus 1 forms the plurality of modified spots 13b so as not to overlap the plurality of modified spots 13a and the plurality of fractures 14a. In addition, the laser processing apparatus 1 forms a plurality of rows of modified spots 13b by moving the converging point C of the laser light L pulse-oscillated along the virtual plane 15 between the rows of the plurality of rows of modified spots 13a. In this step, a plurality of fractures 14b respectively extending from the plurality of modified spots 13b may be connected to the plurality of fractures 14a. In FIGS. 6 and 7, the modified spot 13b is indicated by dot hatching, and a range in which the fracture 14b extends is indicated by a broken line (this is similarly applied to FIGS. 8 to 11).

In the present embodiment, the laser light L pulse-oscillated is modulated by the spatial light modulator 4 so as to be converged at a plurality (for example, six) of converging points C arranged in the Y direction. The plurality of converging points C are relatively moved on the virtual plane 15 along the X direction at the center between the rows of the plurality of rows of modified spots 13a. As an example, the distance between the converging points C adjacent to each other in the Y direction is 8 μm, and the pulse pitch of the laser light L is 10 μm. The pulse energy of the laser light L is 0.33 μJ. In this case, the center-to-center distance between the modified spots 13b adjacent to each other in the Y direction is 8 μm, and the center-to-center distance between the modified spots 13b adjacent to each other in the X direction is 10 μm.

Figure 8:
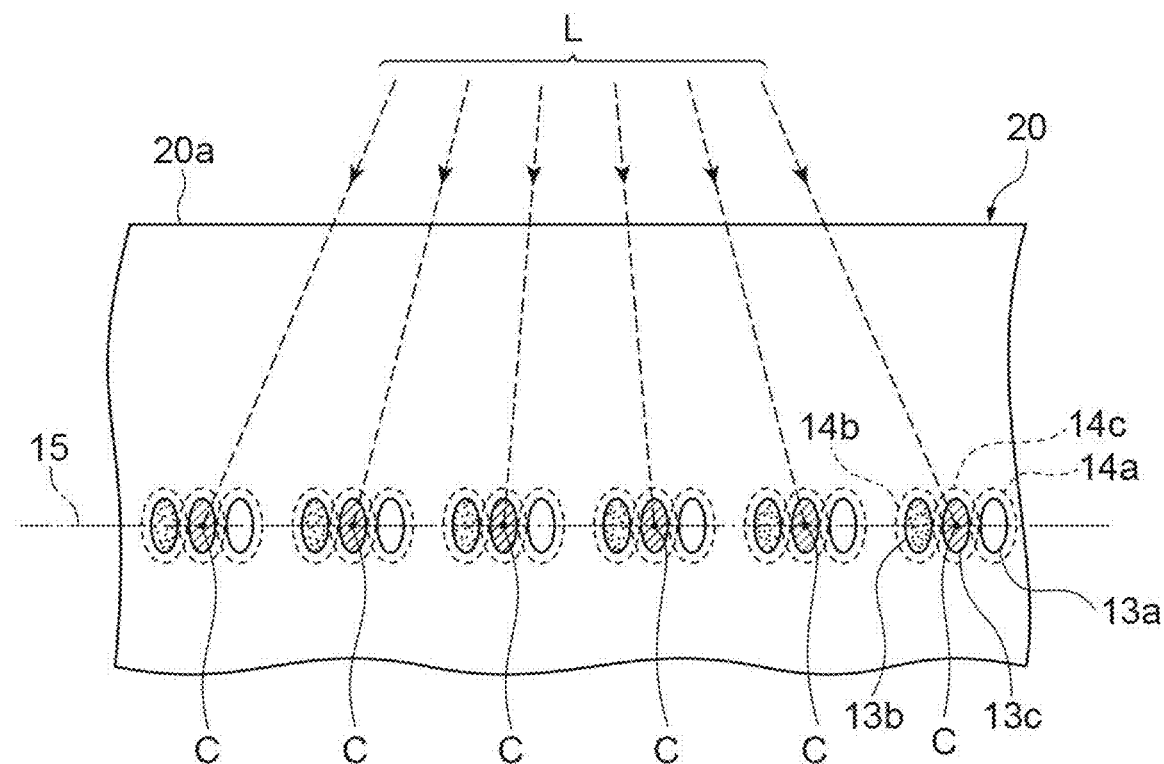
FIG. 8 is a longitudinal sectional view of the portion of the GaN ingot in one step of the laser processing method and the semiconductor member manufacturing method in the first embodiment.
Figure 9:
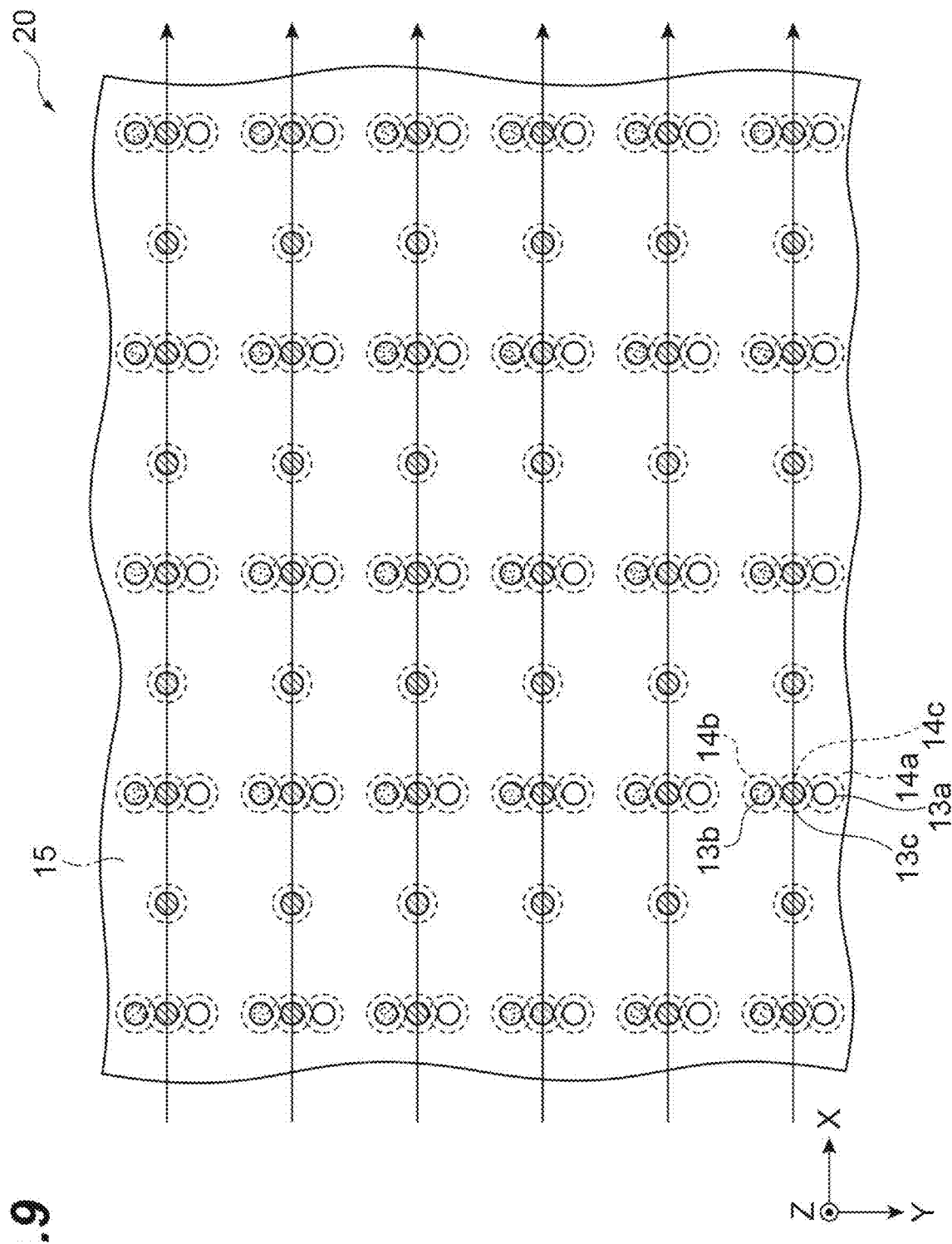
FIG. 9 is a cross-sectional view of the portion of the GaN ingot in one step of the laser processing method and the semiconductor member manufacturing method in the first embodiment.
Figure 11:
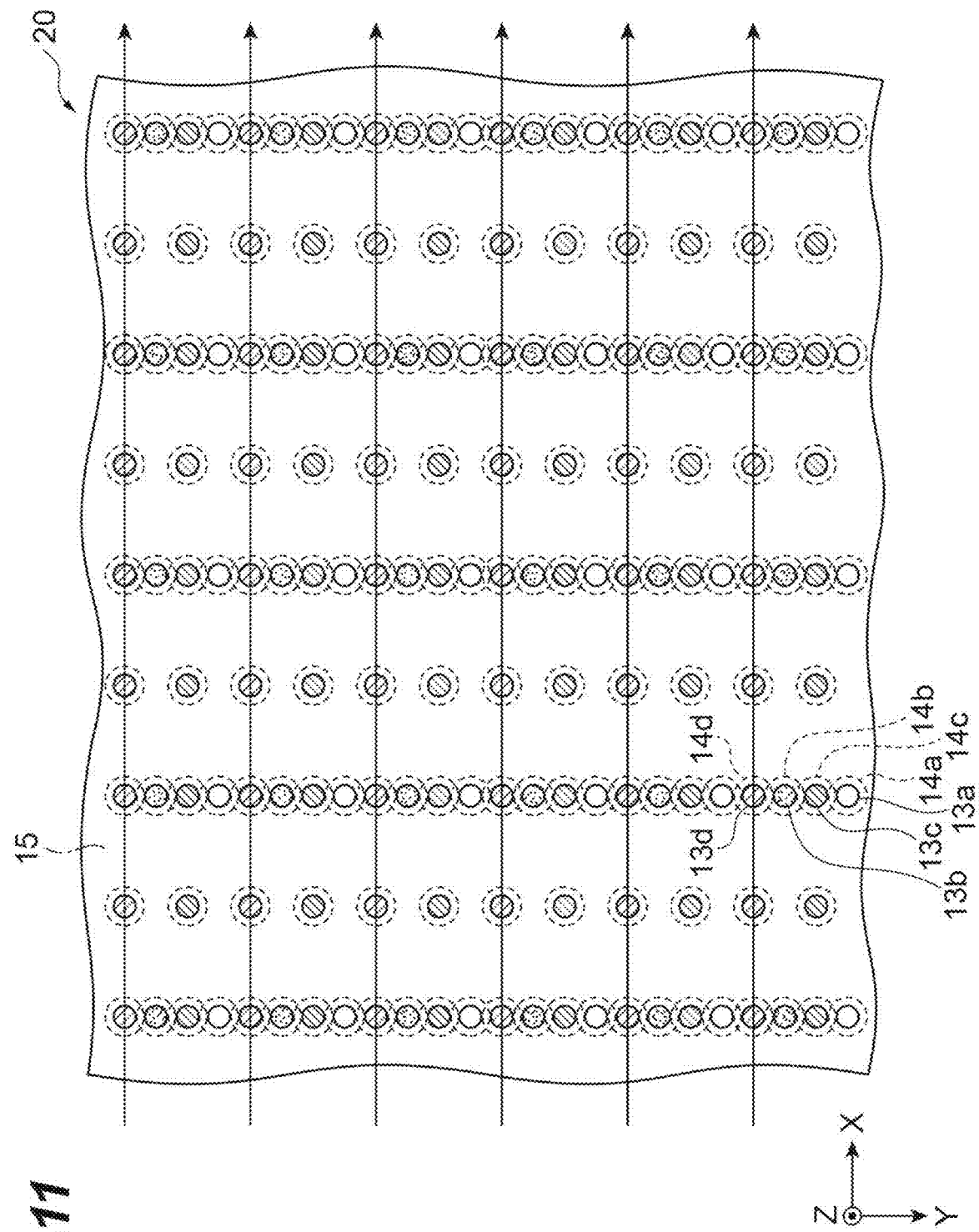
FIG. 11 is a cross-sectional view of the portion of the GaN ingot in one step of the laser processing method and the semiconductor member manufacturing method in the first embodiment.

As illustrated in FIGS. 8 and 9, the laser processing apparatus 1 forms a plurality of modified spots (third modified spots) 13c along the virtual plane 15 (for example, so as to be two-dimensionally arranged along all virtual planes 15) by causing laser light L to enter into the GaN ingot 20 from the surface 20a (second step). Furthermore, as illustrated in FIGS. 10 and 11, the laser processing apparatus 1 forms a plurality of modified spots (third modified spots) 13d along the virtual plane 15 (for example, so as to be two-dimensionally arranged along all virtual planes 15) by causing laser light L to enter into the GaN ingot 20 from the surface 20a (second step). At this time, the laser processing apparatus 1 forms the plurality of modified spots 13c and 13d so as not to overlap the plurality of modified spots 13a and 13b. In addition, the laser processing apparatus 1 forms a plurality of rows of modified spots 13c and 13d by moving the converging point C of the laser light L pulse-oscillated along the virtual plane 15 between the rows of the plurality of rows of modified spots 13a and 13b. In this step, a plurality of fractures 14c and 14d respectively extending from the plurality of modified spots 13c and 13d may be connected to the plurality of fractures 14a and 14b. In FIGS. 8 and 9, the modified spot 13c is indicated by solid-line hatching, and a range in which the fracture 14c extends is indicated by a broken line (this is similarly applied to FIGS. 10 and 11). In FIGS. 10 and 11, the modified spot 13d is indicated by solid-line hatching (solid-line hatching inclined opposite to the solid-line hatching of the modified spot 13c), and a range in which the fracture 14d extends is indicated by a broken line.

In the present embodiment, the laser light L pulse-oscillated is modulated by the spatial light modulator 4 so as to be converged at a plurality (for example, six) of converging points C arranged in the Y direction. The plurality of converging points C are relatively moved on the virtual plane 15 along the X direction at the center between the rows of the plurality of rows of modified spots 13a and 13b. As an example, the distance between the converging points C adjacent to each other in the Y direction is 8 μm, and the pulse pitch of the laser light L is 5 μm. The pulse energy of the laser light L is 0.33 μJ. In this case, the center-to-center distance between the modified spots 13c adjacent to each other in the Y direction is 8 μm, and the center-to-center distance between the modified spots 13c adjacent to each other in the X direction is 5 μm. In addition, the center-to-center distance between the modified spots 13d adjacent to each other in the Y direction is 8 μm, and the center-to-center distance between the modified spots 13d adjacent to each other in the X direction is 5 μm.

Figure 12:
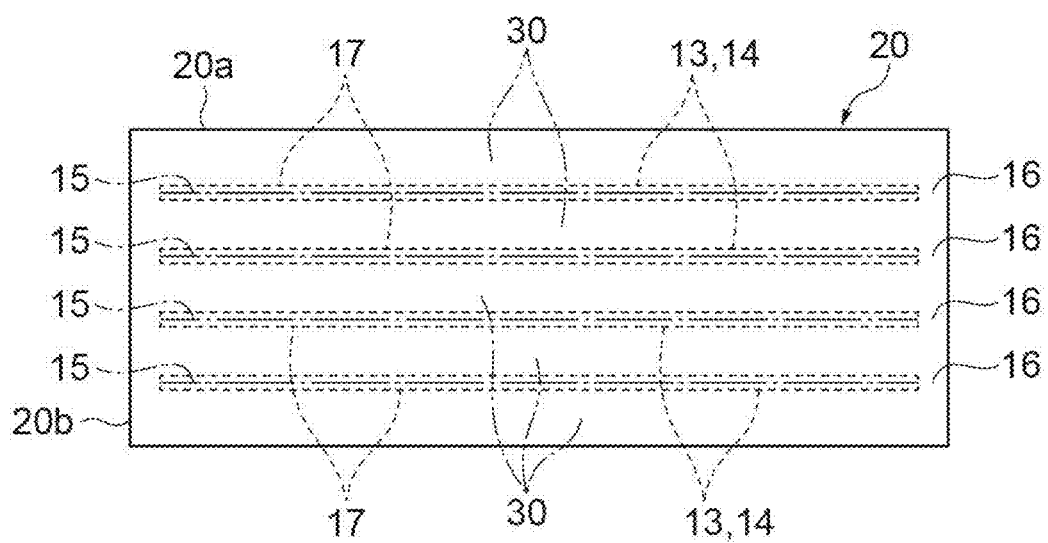
FIG. 12 is a side view illustrating the GaN ingot in one step of the laser processing method and the semiconductor member manufacturing method in the first embodiment.

A heating device including a heater or the like heats the GaN ingot 20, and thus the plurality of fractures 14 respectively extending from the plurality of modified spots 13 are connected to each other in each of the plurality of virtual planes 15. In this manner, as illustrated in FIG. 12, a fracture 17 crossing over the virtual plane 15 (simply referred to as a "fracture 17" below) is formed in each of the plurality of virtual planes 15. In FIG. 12, the plurality of modified spots 13 and the plurality of fractures 14, and a range in which the fracture 17 is formed are indicated by broken lines. A certain force may be caused to act on the GaN ingot 20 by a method other than heating, and thereby the plurality of fractures 14 may be connected to each other to form the fracture 17. In addition, by forming the plurality of modified spots 13 along the virtual plane 15, the plurality of fractures 14 may be connected to each other to form the fracture 17.

Here, in the GaN ingot 20, a nitrogen gas is generated in the plurality of fractures 14 respectively extending from the plurality of modified spots 13. Therefore, by heating the GaN ingot 20 to expand the nitrogen gas, the fracture 17 can be formed by using the pressure (internal pressure) of the nitrogen gas. In addition, the peripheral edge region 16 prevents development of the plurality of fractures 14 to the outside (for example, side surface 20b of the GaN ingot 20) of the virtual plane 15 surrounded by the peripheral edge region 16. Thus, it is possible to suppress escape of the nitrogen gas generated in the plurality of fractures 14 to the outside of the virtual plane 15. That is, the peripheral edge region 16 is a non-modified region that does not include the modified spot 13, and is a region that prevents development of the plurality of fractures 14 to the outside of the virtual plane 15 surrounded by the peripheral edge region 16 when the fracture 17 is formed in the virtual plane 15 surrounded by the peripheral edge region 16. Therefore, the width of the peripheral edge region 16 is preferably equal to or more than 30 μm.

Figure 13:
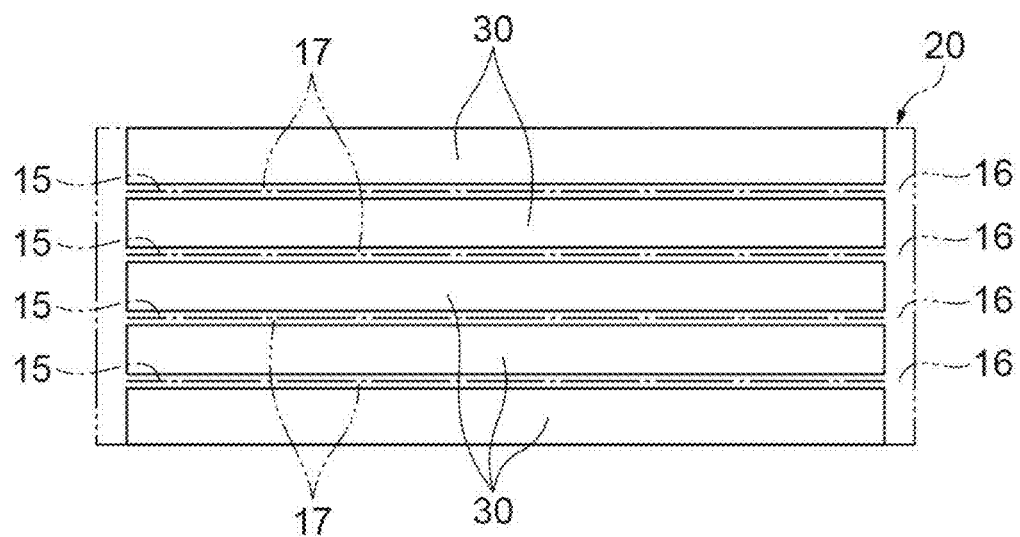
FIG. 13 is a side view illustrating a GaN wafer in one step of the laser processing method and the semiconductor member manufacturing method in the first embodiment.

Then, a grinding device grinds (polishes) a portion of the GaN ingot 20, which corresponds to each of the plurality of peripheral edge regions 16 and the plurality of virtual planes 15 to acquire a plurality of GaN wafers 30 from the GaN ingot 20 by using each of the plurality of fractures 17 as a boundary, as illustrated in FIG. 13 (third step). In this manner, the GaN ingot 20 is cut along each of the plurality of virtual planes 15. In this step, portions of the GaN ingot 20, which correspond to the plurality of peripheral edge regions 16 may be removed by machining other than grinding, laser processing, or the like.

Among the above steps, steps up to the step of forming the plurality of modified spots 13 along each of the plurality of virtual planes 15 correspond to the laser processing method in the first embodiment. Among the above steps, steps up to the step of acquiring the plurality of GaN wafers 30 from the GaN ingot 20 by using each of the plurality of fractures 17 as a boundary correspond to the semiconductor member manufacturing method in the first embodiment.

As described above, in the laser processing method in the first embodiment, the plurality of modified spots 13a are formed along each of the plurality of virtual planes 15, and the plurality of modified spots 13b are formed along each of the plurality of virtual planes 15 so as not to overlap the plurality of modified spots 13a and the plurality of fractures 14a. Further, in the laser processing method in the first embodiment, the plurality of modified spots 13c and 13d are formed along each of the plurality of virtual planes 15 so as not to overlap the plurality of modified spots 13a and 13b. Thus, it is possible to form the plurality of modified spots 13 along each of the plurality of virtual planes 15 with high precision. As a result, it is possible to form the fracture 17 along each of the plurality of virtual planes 15 with high precision. Therefore, according to the laser processing method in the first embodiment, it is possible to acquire a plurality of suitable GaN wafers 30 by acquiring a plurality of GaN wafers 30 from the GaN ingot 20 by using each of the plurality of fractures 17 as a boundary.

Similarly, according to the laser processing apparatus 1 that performs the laser processing method in the first embodiment, it is possible to form the fracture 17 along each of the plurality of virtual planes 15 with high precision. Thus, it is possible to acquire a plurality of suitable GaN wafers 30.

In addition, in the laser processing method in the first embodiment, the plurality of modified spots 13a are formed so that the plurality of fractures 14a respectively extending from the plurality of modified spots 13a are not connected to each other. Thus, it is possible to form the plurality of modified spots 13b along the virtual plane 15 with higher precision.

In addition, in the laser processing method in the first embodiment, the plurality of rows of modified spots 13a are formed by moving the converging point C of the laser light L pulse-oscillated along the virtual plane 15. Then, the plurality of rows of modified spots 13b are formed by moving the converging point C of the laser light L pulse-oscillated along the virtual plane 15 between the rows of the plurality of rows of modified spots 13a. Thus, it is possible to reliably prevent overlapping of the plurality of modified spots 13b with the plurality of modified spots 13a and the plurality of fractures 14a, and to form the plurality of modified spots 13b along the virtual plane 15 with higher precision.

In particular, in the laser processing method in the first embodiment, if gallium nitride contained in the material of the GaN ingot 20 is decomposed by irradiation with the laser light L, gallium is deposited on the plurality of fractures 14a respectively extending from the plurality of modified spots 13a, and the laser light L is easily absorbed by the gallium. Therefore, forming the plurality of modified spots 13b so as not to overlap the fractures 14a is effective in forming the plurality of modified spots 13b along the virtual plane 15 with high precision.

In the laser processing method in the first embodiment, if gallium nitride contained in the material of the GaN ingot 20 is decomposed by irradiation with the laser light L, a nitrogen gas is generated in the plurality of fractures 14. Therefore, it is possible to easily form the fracture 17 by using pressure of the nitrogen gas.

Further, according to the semiconductor member manufacturing method in the first embodiment, with the step included in the laser processing method in the first embodiment, it is possible to form the fracture 17 along each of the plurality of virtual planes 15 with high precision. Thus, it is possible to acquire a plurality of suitable GaN wafers 30.

In addition, in the semiconductor member manufacturing method in the first embodiment, the plurality of virtual planes 15 are set to be arranged in a direction facing the surface 20a of the GaN ingot 20. This makes it possible to acquire a plurality of GaN wafers 30 from one GaN ingot 20.

Here, experimental results showing that, in a GaN wafer 30 formed by the laser processing method and the semiconductor member manufacturing method in the first embodiment, the unevenness appearing on the peeling surface of the GaN wafer 30 is reduced will be described.

Figure 14:
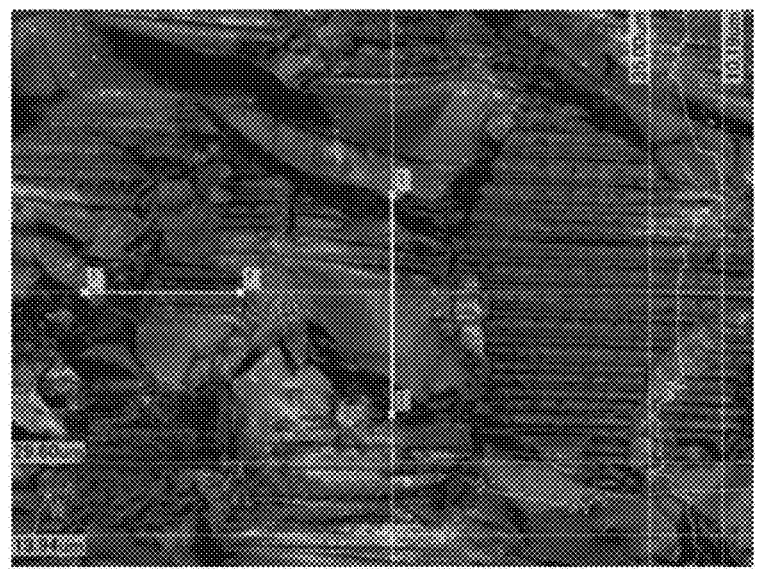
FIG. 14 shows an image of a peeling surface of a GaN wafer formed by a laser processing method and a semiconductor member manufacturing method in an example.
Figure 15:
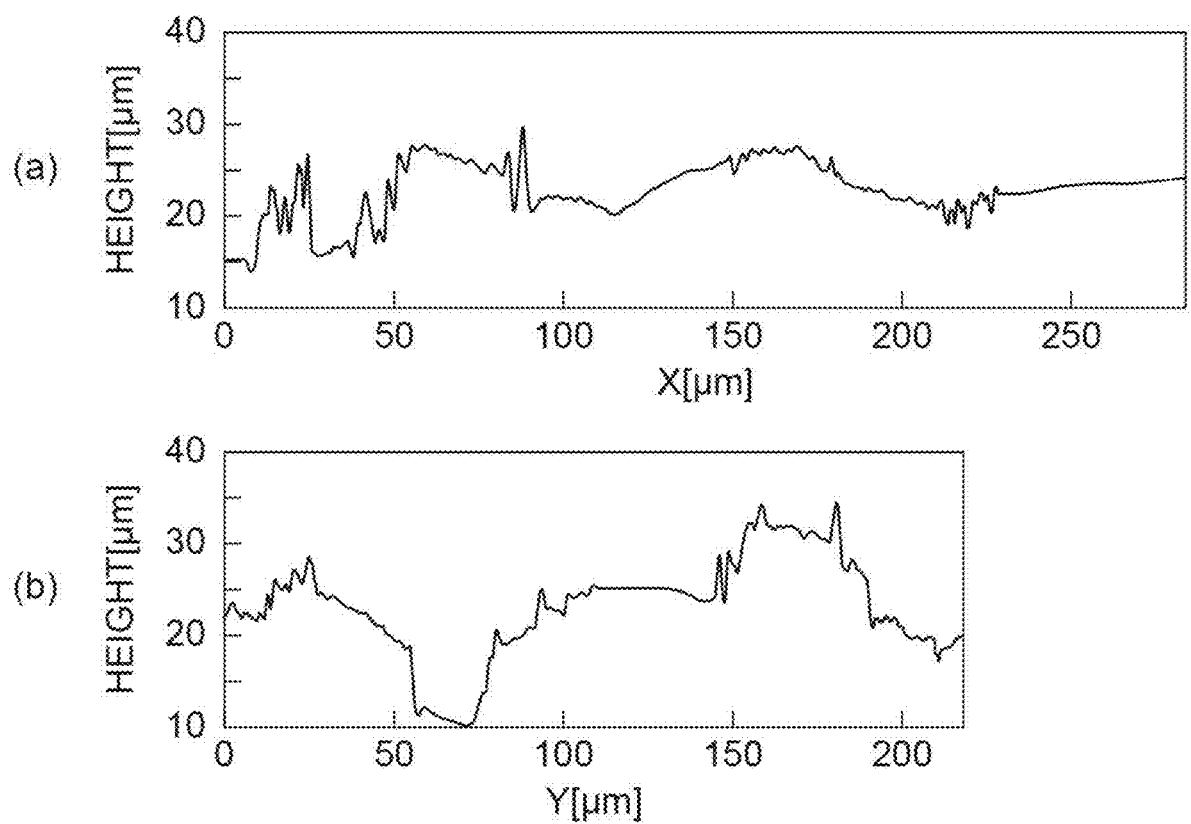
FIG. 15 shows a height profile of the peeling surface illustrated in FIG. 14.

FIG. 14 shows an image of a peeling surface of a GaN wafer formed by a laser processing method and semiconductor member manufacturing method in an example. (a) and (b) of FIG. 15 show height profiles of the peeling surface illustrated in FIG. 14. In this example, a plurality of modified spots 13 were formed along a virtual plane 15 in a manner that laser light L having a wavelength of 532 nm entered into a GaN ingot 20 from a surface 20a of the GaN ingot 20, and one converging point C was relatively moved on the virtual plane 15 along the X direction. At this time, the distance between the converging points C adjacent to each other in the Y direction was set to 10 µm, the pulse pitch of the laser light L was set to 1 µm, and the pulse energy of the laser light L was set to 1 µJ. In this case, as illustrated in (a) and (b) of FIG. 15, the unevenness of about 25 µm appeared on the peeling surface (surface formed by the fracture 17) of the GaN wafer 30.

Figure 16:
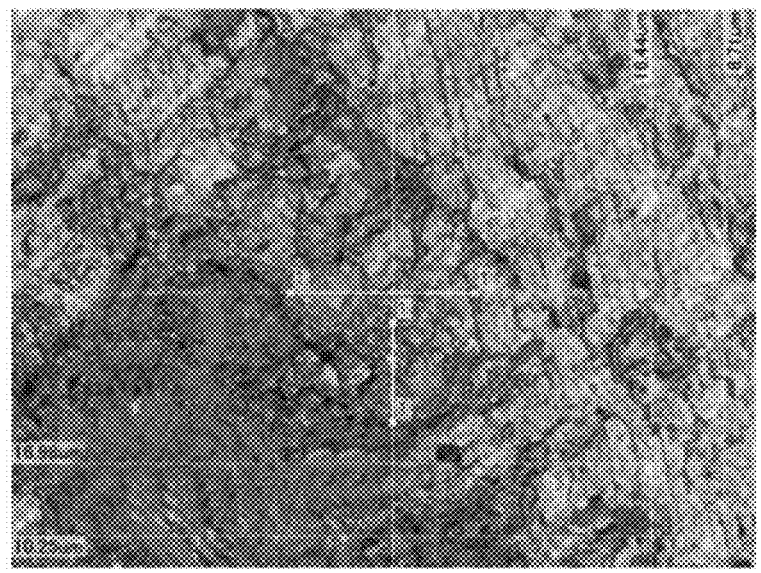
FIG. 16 is an image of a peeling surface of a GaN wafer formed by a laser processing method and a semiconductor member manufacturing method in another example.
Figure 17:
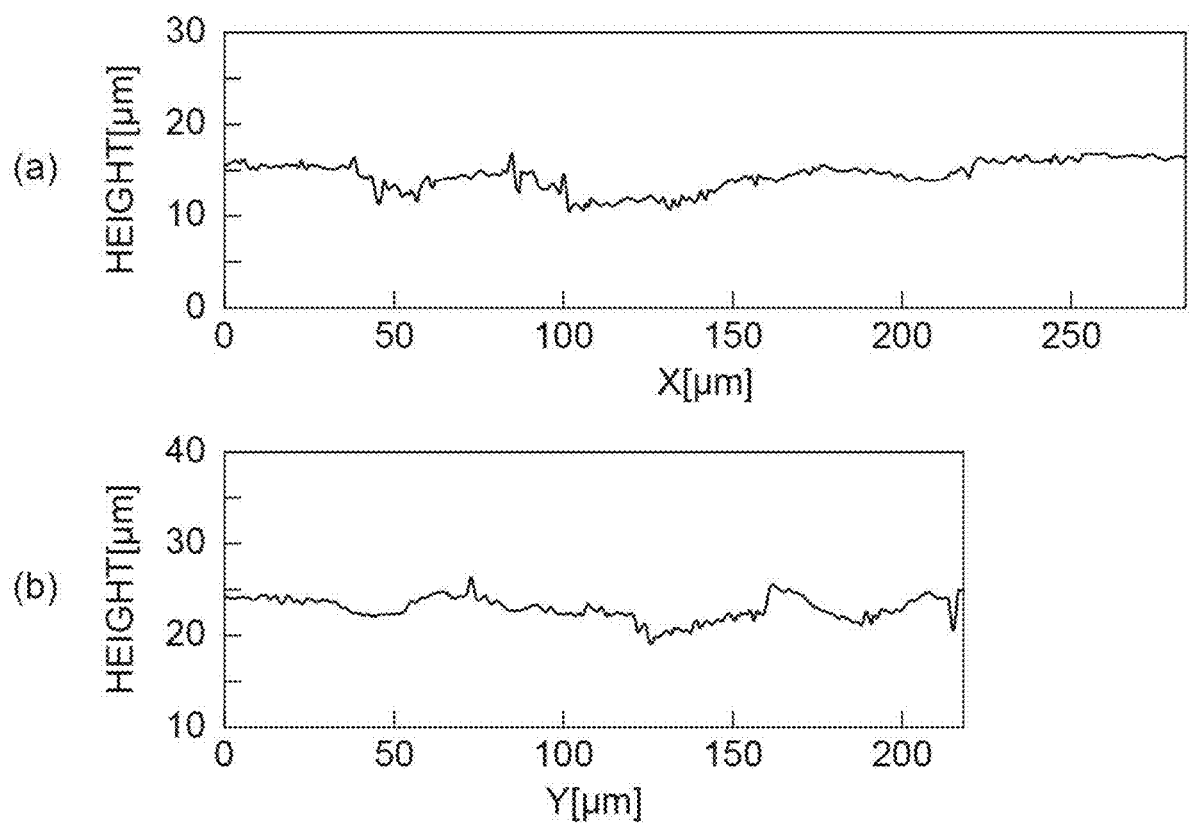
FIG. 17 shows a height profile of the peeling surface illustrated in FIG. 16.

FIG. 16 shows an image of a peeling surface of a GaN wafer formed by a laser processing method and semiconductor member manufacturing method in another example. (a) and (b) of FIG. 17 show height profiles of the peeling surface illustrated in FIG. 16. In this example, a plurality of modified spots 13 were formed along a virtual plane 15 in a similar manner to the first step and the second step of the laser processing method and the semiconductor member manufacturing method in the first embodiment, in which laser light L having a wavelength of 532 nm entered into a GaN ingot 20 from a surface 20a of the GaN ingot 20. When the plurality of modified spots 13a were formed, the distance between the converging points C adjacent to each other in the Y direction was set to 6 µm, the pulse pitch of the laser light L was set to 10 µm, and the pulse energy of the laser light L was set to 0.33 µJ. When the plurality of modified spots 13b were formed, the distance between the converging points C adjacent to each other in the Y direction was set to 6 µm, the pulse pitch of the laser light L was set to 10 µm, and the pulse energy of the laser light L was set to 0.33 µJ. When the plurality of modified spots 13c were formed, the distance between the converging points C adjacent to each other in the Y direction was set to 6 µm, the pulse pitch of the laser light L was set to 5 µm, and the pulse energy of the laser light L was set to 0.33 µJ. When the plurality of modified spots 13d were formed, the distance between the converging points C adjacent to each other in the Y direction was set to 6 µm, the pulse pitch of the laser light L was set to 5 µm, and the pulse energy of the laser light L was set to 0.33 µJ. In this case, as illustrated in (a) and (b) of FIG. 17, the unevenness of about 5 µm appeared on the peeling surface of the GaN wafer 30.

From the above experimental results, it has been understood that, in the GaN wafer formed by the laser processing method and the semiconductor member manufacturing method in the first embodiment, the unevenness appearing on the peeling surface of the GaN wafer 30 is reduced, that is, the fracture 17 is formed along the virtual plane 15 with high precision. If the unevenness appearing on the peeling surface of GaN wafer 30 is reduced, the amount of grinding for planarizing the peeling surface is reduced. Thus, reducing the unevenness appearing on the peeling surface of GaN wafer 30 is advantageous in terms of material use efficiency and production efficiency.

Next, a principle of the unevenness appearing on the peeling surface of the GaN wafer 30 will be described.

Figure 18:
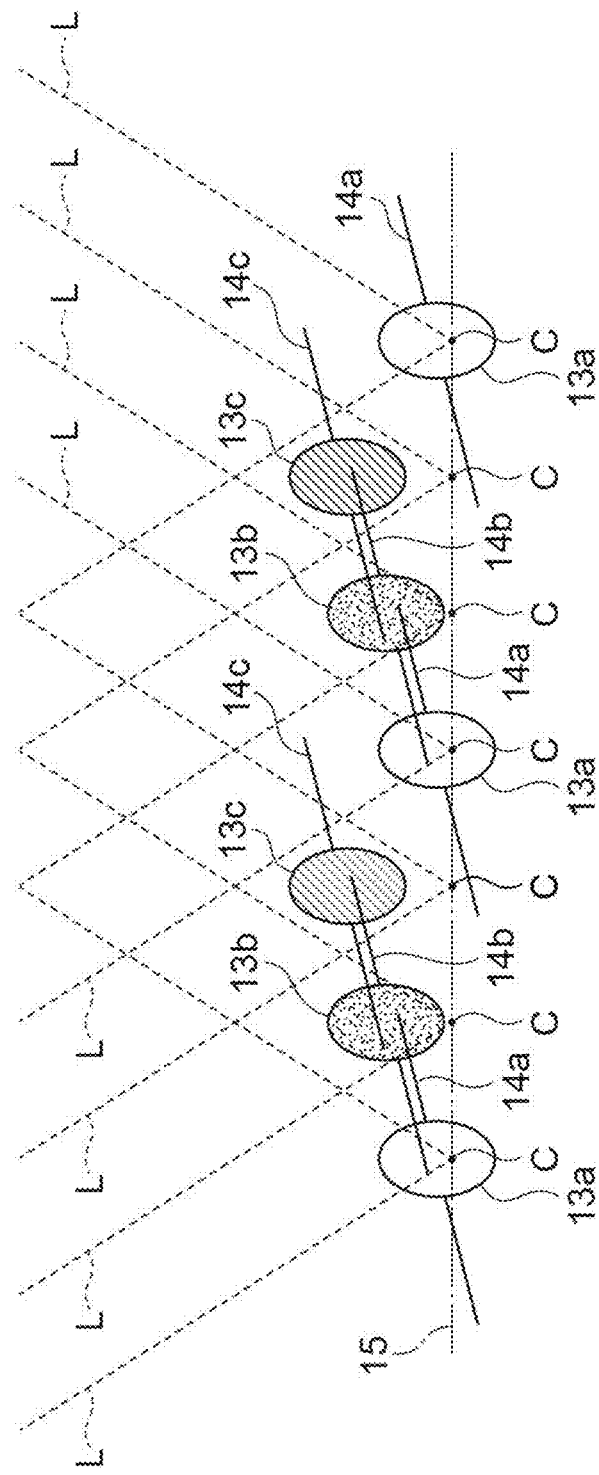
FIG. 18 is a schematic view illustrating a principle of forming the peeling surface by a laser processing method and a semiconductor member manufacturing method in an example.

For example, as illustrated in FIG. 18, a plurality of modified spots 13a are formed along the virtual plane 15, and a plurality of modified spots 13b are formed along the virtual plane 15 so that the modified spot 13b overlaps a fracture 14a extending from the modified spot 13a on one side thereof. In this case, since laser light L is easily absorbed by gallium deposited on a plurality of fractures 14a, it is easy to form the modified spot 13b on the incident side of the laser light L with respect to the modified spot 13a even though the converging point C is located on the virtual plane 15. Then, a plurality of modified spots 13c are formed along the virtual plane 15 so that the modified spot 13c overlaps a fracture 14b extending from the modified spot 13b on one side thereof. Also in this case, since laser light L is easily absorbed by gallium deposited on a plurality of fractures 14b, it is easy to form the modified spot 13c on the incident side of the laser light L with respect to the modified spot 13b even though the converging point C is located on the virtual plane 15. As described above, in this example, the plurality of modified spots 13b are easily formed on the incident side of the laser light L with respect to the plurality of modified spots 13a, and the plurality of modified spots 13c are easily formed on the incident side of the laser light L with respect to the plurality of modified spots 13b.

Figure 19:
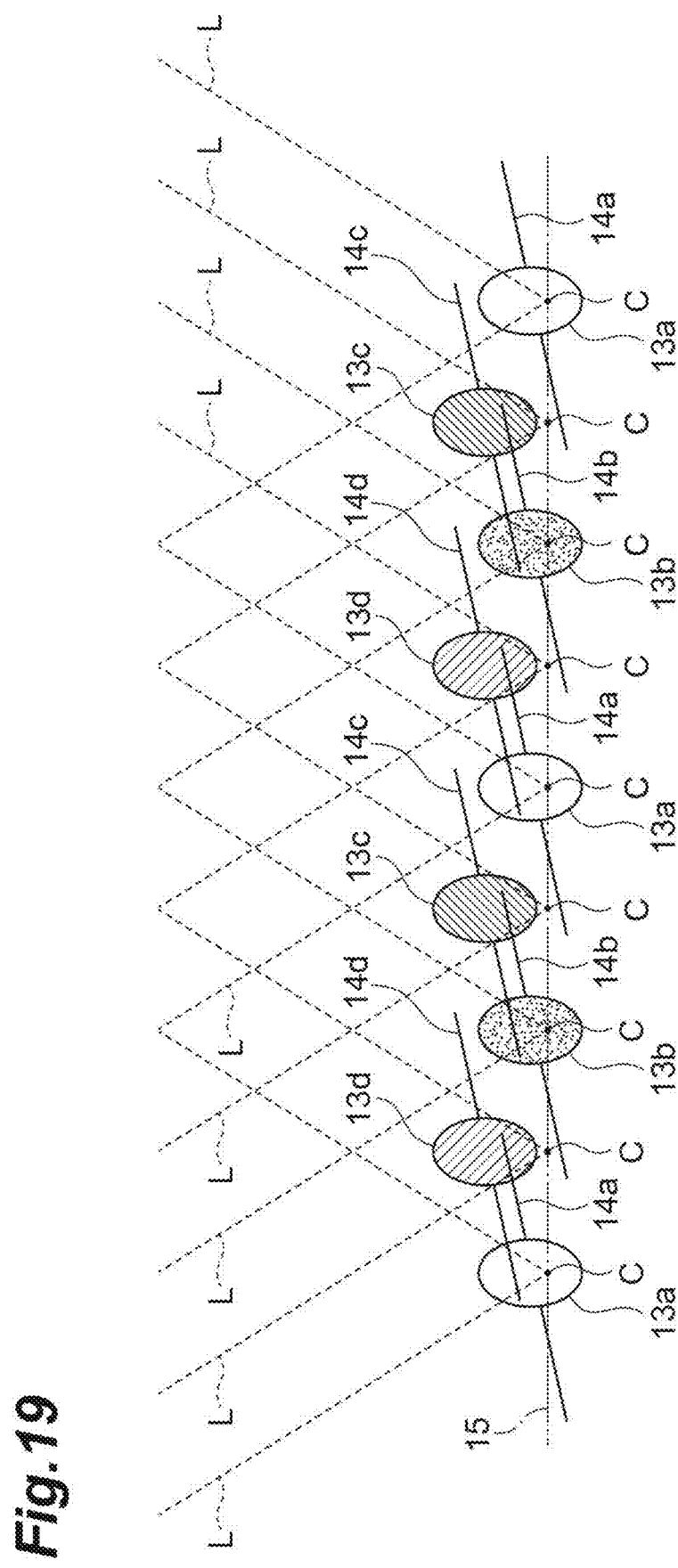
FIG. 19 is a schematic view illustrating a principle of forming the peeling surface by a laser processing method and a semiconductor member manufacturing method in another example.

On the other hand, for example, as illustrated in FIG. 19, a plurality of modified spots 13a are formed along the virtual plane 15, and a plurality of modified spots 13b are formed along the virtual plane 15 so that the modified spots 13b do not overlap the fractures 14a extending from the modified spots 13a on both sides thereof. In this case, although the laser light L is easily absorbed by gallium deposited on the plurality of fractures 14a, the modified spots 13b are also formed on the virtual plane 15 similarly to the modified spots 13a, because the modified spots 13b do not overlap the fractures 14a. Then, a plurality of modified spots 13c are formed along the virtual plane 15 so that the modified spots 13c overlap the fractures 14a and 14b respectively extending from the modified spots 13a and 13b on both sides thereof. Further, a plurality of modified spots 13d are formed along the virtual plane 15 so that the modified spots 13d overlap the fractures 14a and 14b respectively extending from the modified spots 13a and 13b on both sides thereof. In these cases, since laser light L is easily absorbed by gallium deposited on the plurality of fractures 14a and 14b, it is easy to form the modified spots 13c and 13d on the incident side of the laser light L with respect to the modified spots 13a and 13b even though the converging point C is located on the virtual plane 15. As described above, in this example, the plurality of modified spots 13c and 13d are only easily formed on the incident side of the laser light L with respect to the plurality of modified spots 13a and 13b.

From the above principle, it can be understood that, in the laser processing method and the semiconductor member manufacturing method in the first embodiment, it is very important to form the plurality of modified spots 13b so as not to overlap the plurality of modified spots 13a and the plurality of fractures 14a respectively extending from the plurality of modified spots 13a, in order to reduce the unevenness appearing on the peeling surface of the GaN wafer 30.

Next, experimental results showing that, in the laser processing method and the semiconductor member manufacturing method in the first embodiment, the fracture 17 is developed along the virtual plane 15 with high precision will be described.

Figure 20:
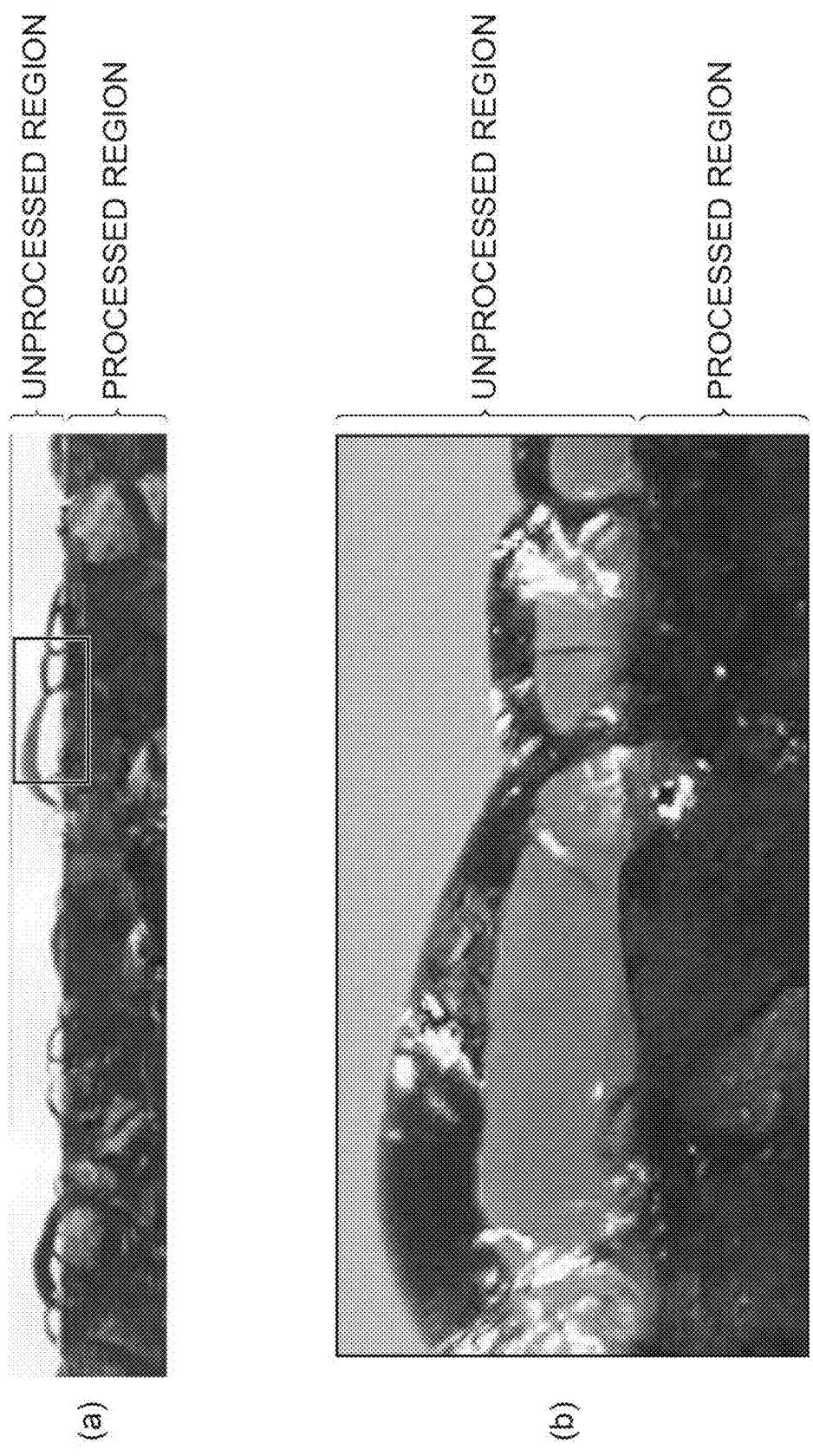
FIG. 20 shows an image of a fracture formed in the middle of a laser processing method and a semiconductor member manufacturing method in an example.

(a) and (b) of FIG. 20 show images of a fracture formed in the middle of a laser processing method and a semiconductor member manufacturing method in an example. (b) of FIG. 20 shows an enlarged image in a rectangular frame in (a) of FIG. 20. In this example, a plurality of modified spots 13 were formed along a virtual plane 15 in a manner that laser light L having a wavelength of 532 nm entered into a GaN ingot 20 from a surface 20a of the GaN ingot 20, and six converging points C arranged in the Y direction were relatively moved on the virtual plane 15 along the X direction. At this time, the distance between the converging points C adjacent to each other in the Y direction was set to 6 µm, the pulse pitch of the laser light L was set to 1 µm, and the pulse energy of the laser light L was set to 1.33 µJ. Laser processing was stopped in the middle of the virtual plane 15. In this case, as illustrated in (a) and (b) of FIG. 20, the fracture developed from a processed region to an unprocessed region was greatly deviated from the virtual plane 15 in the unprocessed region.

Figure 21:
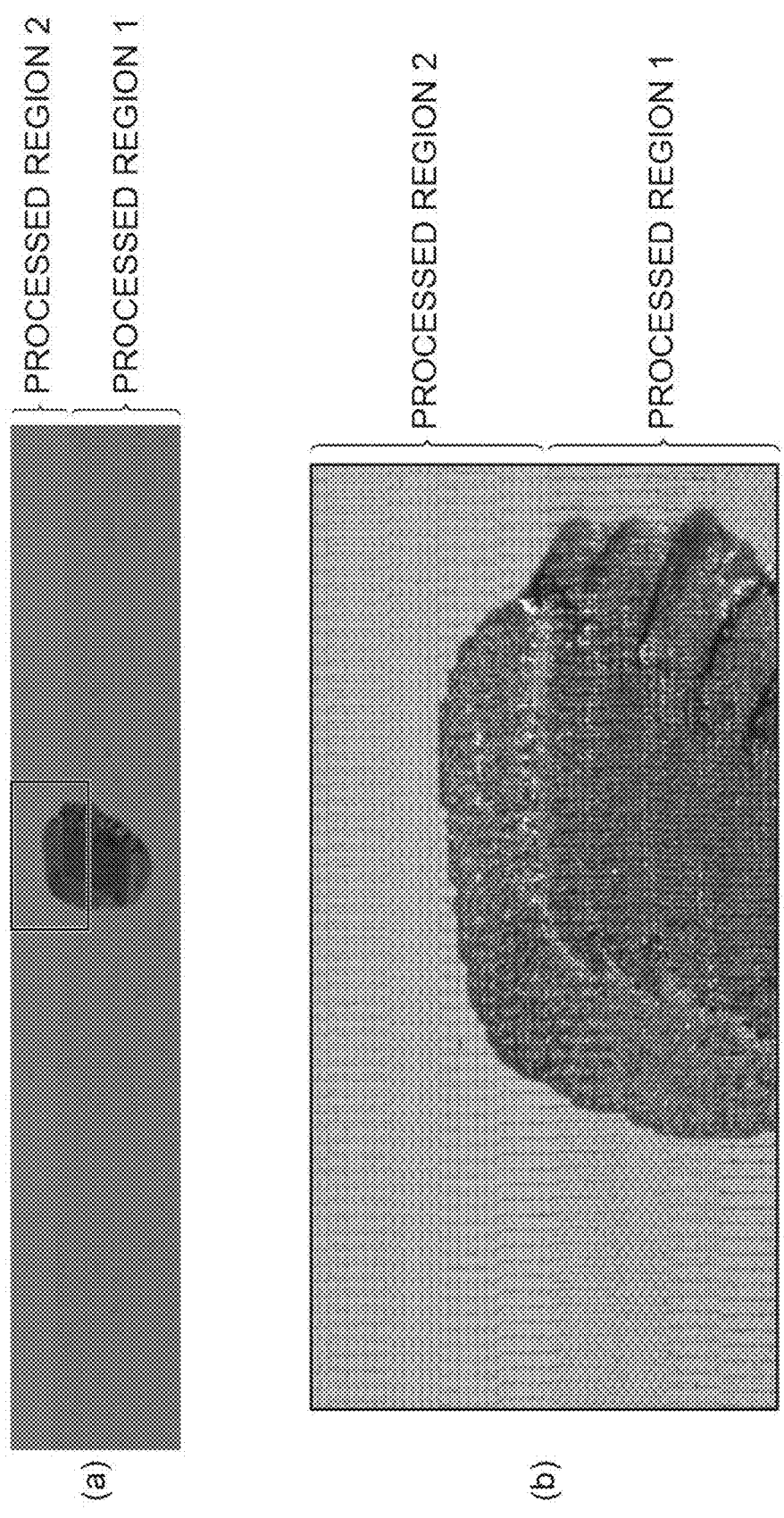
FIG. 21 shows an image of a fracture formed in the middle of a laser processing method and a semiconductor member manufacturing method in another example.

(a) and (b) of FIG. 21 show images of a fracture formed in the middle of a laser processing method and a semiconductor member manufacturing method in another example. (b) of FIG. 21 shows an enlarged image in a rectangular frame in (a) of FIG. 21. In this example, a plurality of modified spots 13 were formed along a virtual plane 15 in a manner that laser light L having a wavelength of 532 nm entered into a GaN ingot 20 from a surface 20a of the GaN ingot 20, and six converging points C arranged in the Y direction were relatively moved on the virtual plane 15 along the X direction. Specifically, firstly, a plurality of rows of modified spots 13 were formed in Processed region 1 and Processed region 2 in a state where the distance between the converging points C adjacent to each other in the Y direction was set to 6 µm, the pulse pitch of the laser light L was set to 10 µm, and the pulse energy of the laser light L was set to 0.33 µJ. Then, a plurality of rows of modified spots 13 were formed in Processed region 1 and Processed region 2 in a state where the distance between the converging points C adjacent to each other in the Y direction was set to 6 µm, the pulse pitch of the laser light L was set to 10 µm, and the pulse energy of the laser light L was set to 0.33 µJ, so that each of the above rows is located between the rows of the plurality of rows of modified spots 13 already formed. Then, a plurality of rows of modified spots 13 were formed only in Processed region 1 in a state where the distance between the converging points C adjacent to each other in the Y direction was set to 6 µm, the pulse pitch of the laser light L was set to 5 µm, and the pulse energy of the laser light L was set to 0.33 µJ, so that each of the above rows is located between the rows of the plurality of rows of modified spots 13 already formed. In this case, as illustrated in (a) and (b) of FIG. 21, the fracture developed from Processed region 1 to Processed region 2 was not greatly deviated from the virtual plane 15 in Processed region 2.

From the above experimental results, it has been understood that, in the laser processing method and the semiconductor member manufacturing method in the first embodiment, the fracture 17 is developed along the virtual plane 15 with high precision. The reason is assumed as follows: the plurality of modified spots 13 previously formed in Processed region 2 function as guides when the fracture is developed.

Next, experimental results showing that, in the laser processing method and the semiconductor member manufacturing method in the first embodiment, the extension amount of the fracture 14 extending from the modified spot 13 to the incident side of the laser light L and the opposite side thereof is suppressed will be described.

Figure 22:
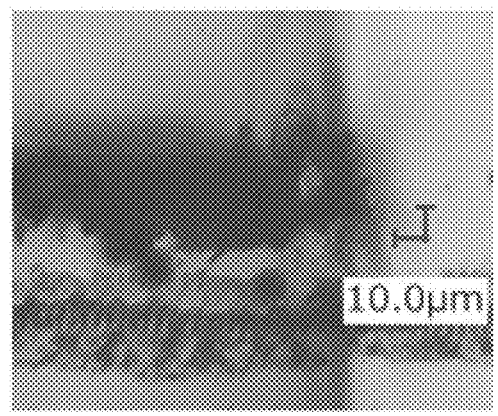
FIG. 22 shows an image of a modified spot and a fracture formed by a laser processing method and a semiconductor member manufacturing method in a comparative example.

FIG. 22 shows an image (image in a side view) of a modified spot and a fracture formed by a laser processing method and a semiconductor member manufacturing method in a comparative example. In the comparative example, a plurality of modified spots 13 were formed along a virtual plane 15 in a manner that laser light L having a wavelength of 532 nm entered into a GaN ingot 20 from a surface 20a of the GaN ingot 20, and one converging point C was relatively moved on the virtual plane 15 along the X direction. Specifically, the plurality of modified spots 13 were formed along the virtual plane 15 in a state where the distance between the converging points C adjacent to each other in the Y direction was set to 2 µm, the pulse pitch of the laser light L was set to 5 µm, and the pulse energy of the laser light L was set to 0.3 µJ. In this case, as illustrated in FIG. 22, the extension amount of the fracture 14 extending from the modified spot 13 to the incident side of the laser light L and the opposite side thereof was about 100 µm.

Figure 23:
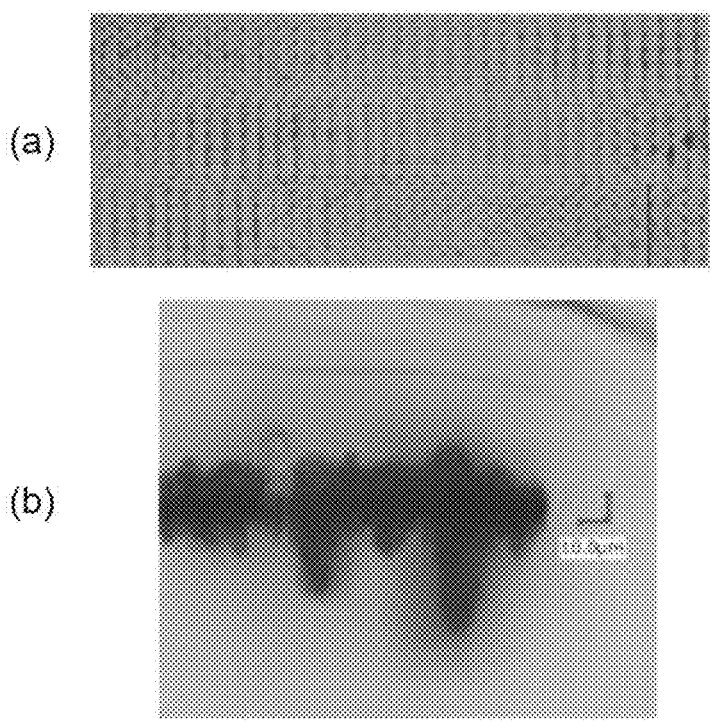
FIG. 23 shows an image of a modified spot and a fracture formed by a laser processing method and a semiconductor member manufacturing method in a first example.

FIG. 23 shows images of a modified spot and a fracture formed by a laser processing method and a semiconductor member manufacturing method in a first example. (a) of FIG. 23 shows an image in plan view, and (b) of FIG. 23 shows an image in a side view. In the first example, a plurality of modified spots 13 were formed along a virtual plane 15 in a manner that laser light L having a wavelength of 532 nm entered into a GaN ingot 20 from a surface 20a of the GaN ingot 20, and six converging points C arranged in the Y direction were relatively moved on the virtual plane 15 along the X direction. Specifically, firstly, a plurality of modified spots 13a were formed along the virtual plane 15 in a state where the distance between the converging points C adjacent to each other in the Y direction was set to 8 µm, the pulse pitch of the laser light L was set to 10 µm, and the pulse energy of the laser light L was set to 0.3 µJ. Then, a plurality of modified spots 13b were formed along the virtual plane 15 in a state where the distance between the converging points C adjacent to each other in the Y direction was set to 8 µm, the pulse pitch of the laser light L was set to 10 µm, and the pulse energy of the laser light L was set to 0.3 µJ in a state where the six converging points C arranged in the Y direction are shifted from the previous state in the Y direction by +4 µm. Then, a plurality of modified spots 13 were formed along the virtual plane 15 in a state where the distance between the converging points C adjacent to each other in the Y direction was set to 8 µm, the pulse pitch of the laser light L was set to 5 µm, and the pulse energy of the laser light L was set to 0.3 µJ in a state where the six converging points C arranged in the Y direction are shifted from the previous state in the Y direction by −4 µm. Then, a plurality of modified spots 13 were formed along the virtual plane 15 in a state where the distance between the converging points C adjacent to each other in the Y direction was set to 8 µm, the pulse pitch of the laser light L was set to 5 µm, and the pulse energy of the laser light L was set to 0.3 µm in a state where the six converging points C arranged in the Y direction are shifted from the previous state in the Y direction by +4 µm. Thus, it is assumed that the modified spot 13a formed at the first time overlaps the modified spot 13 formed at the third time, and the modified spot 13b formed at the second time overlaps the modified spot 13 formed at the fourth time. In this case, as illustrated in (b) of FIG. 23, the extension amount of the fracture 14 extending from the modified spot 13 to the incident side of the laser light L and the opposite side thereof was about 70 μm.

Figure 24:
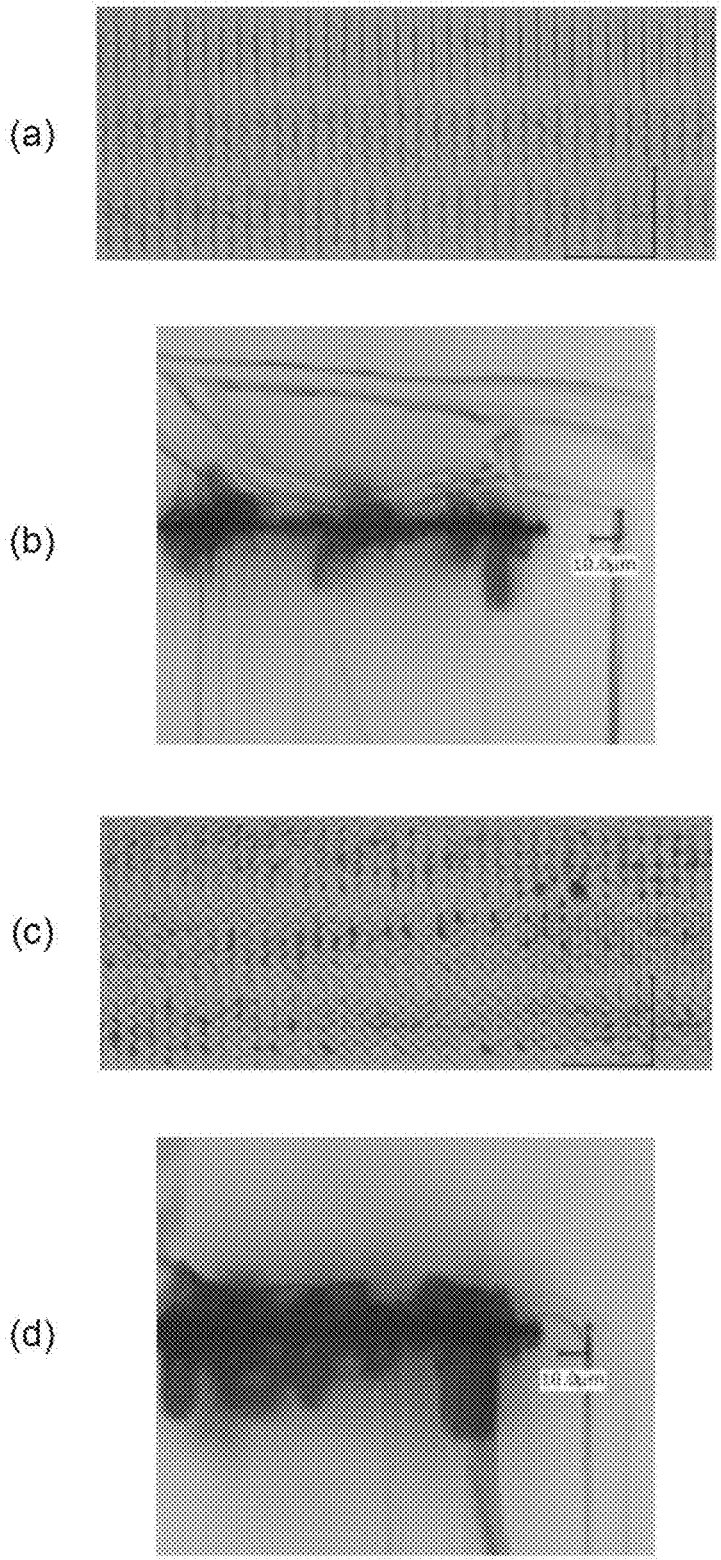
FIG. 24 shows an image of a modified spot and a fracture formed by a laser processing method and a semiconductor member manufacturing method in a second example and a third example.

(a) and (b) of FIG. 24 show images of a modified spot and a fracture formed by a laser processing method and a semiconductor member manufacturing method in a second example. (a) of FIG. 24 shows an image in plan view, and (b) of FIG. 24 shows an image in a side view. In the second example, a plurality of modified spots 13 were formed along a virtual plane 15 in a similar manner to the first step and the second step of the laser processing method and the semiconductor member manufacturing method in the first embodiment, in which laser light L having a wavelength of 532 nm entered into a GaN ingot 20 from a surface 20a of the GaN ingot 20. When the plurality of modified spots 13a were formed, the distance between the converging points C adjacent to each other in the Y direction was set to 8 μm, the pulse pitch of the laser light L was set to 10 μm, and the pulse energy of the laser light L was set to 0.3 μJ. When the plurality of modified spots 13b were formed, the distance between the converging points C adjacent to each other in the Y direction was set to 8 μm, the pulse pitch of the laser light L was set to 10 μm, and the pulse energy of the laser light L was set to 0.3 μJ. When the plurality of modified spots 13c were formed, the distance between the converging points C adjacent to each other in the Y direction was set to 8 μm, the pulse pitch of the laser light L was set to 5 μm, and the pulse energy of the laser light L was set to 0.3 μJ. When the plurality of modified spots 13d were formed, the distance between the converging points C adjacent to each other in the Y direction was set to 8 μm, the pulse pitch of the laser light L was set to 5 μm, and the pulse energy of the laser light L was set to 0.3 μJ. In this case, as illustrated in (b) of FIG. 24, the extension amount of the fracture 14 extending from the modified spot 13 to the incident side of the laser light L and the opposite side thereof was about 50 μm.

(c) and (d) of FIG. 24 show images of a modified spot and a fracture formed by a laser processing method and a semiconductor member manufacturing method in a third example. (c) of FIG. 24 shows an image in plan view, and (d) of FIG. 24 shows an image in a side view. In the third example, a plurality of modified spots 13 were further formed along the virtual plane 15 in the state illustrated in (a) and (b) of FIG. 24 (that is, virtual plane 15 on which the plurality of rows of modified spots 13 were already formed). Specifically, firstly, a plurality of rows of modified spots 13 were formed in a state where the distance between the converging points C adjacent to each other in the Y direction was set to 8 μm, the pulse pitch of the laser light L was set to 5 μm, and the pulse energy of the laser light L was set to 0.1 μJ, so that each of the above rows is located between the rows of the plurality of rows of modified spots 13 already formed. In this case, as illustrated in (d) of FIG. 24, the extension amount of the fracture 14 extending from the modified spot 13 to the incident side of the laser light L and the opposite side thereof was about 60 μm.

From the above experimental results, it has been understood that, if the plurality of modified spots 13b are formed along the virtual plane 15 so as not to overlap the plurality of modified spots 13a already formed along the virtual plane 15 and the plurality of fractures 14a (first example, second example, and third example), the extension amount of the fracture 14 extending from the modified spot 13 to the incident side of the laser light L and the opposite side thereof is suppressed. When the plurality of modified spots 13 are further formed along the virtual plane 15, if the plurality of modified spots 13 are formed along the virtual plane 15 so as not to overlap the plurality of modified spots 13a and 13b already formed along the virtual plane 15 (second example and third example), it is easy to form a fracture crossing over the virtual plane 15.

[Laser Processing Method and Semiconductor Member Manufacturing Method in Second Embodiment]

Figure 25:
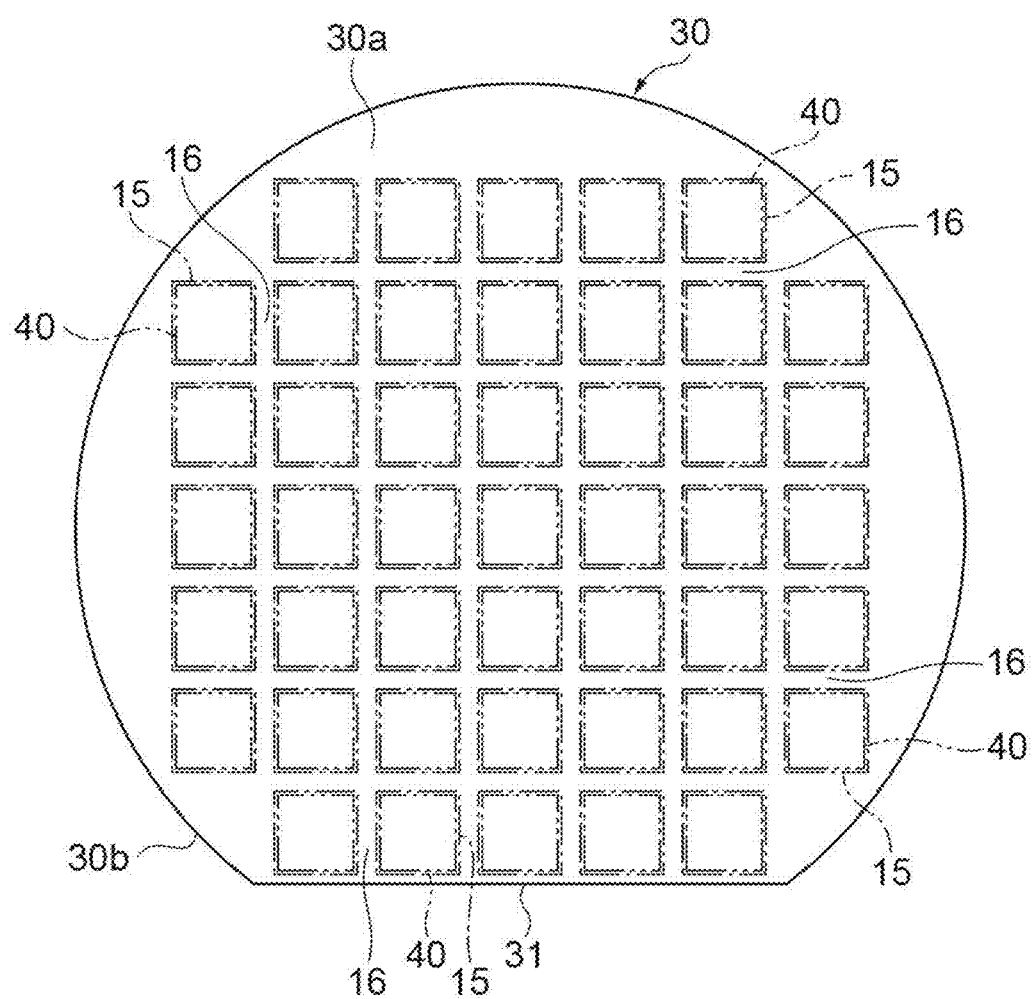
FIG. 25 is a plan view illustrating a GaN wafer which is an object of a laser processing method and a semiconductor member manufacturing method according to a second embodiment.

As illustrated in FIG. 25, an object 11 of a laser processing method and a semiconductor member manufacturing method according to a second embodiment is a GaN wafer (semiconductor wafer, semiconductor object) 30 formed of GaN in, for example, a disc shape. As an example, the diameter of the GaN wafer 30 is 2 in and the thickness of the GaN wafer 30 is 100 μm. The laser processing method and the semiconductor member manufacturing method in the second embodiment are performed to cut out a plurality of semiconductor devices (semiconductor members) 40 from the GaN wafer 30. As an example, the outer shape of the GaN substrate portion of the semiconductor device 40 is 1 mm×1 mm, and the thickness of the GaN substrate portion of the semiconductor device 40 is several tens of μm.

Firstly, the laser processing apparatus 1 described above forms a plurality of modified spots 13 along each of a plurality of virtual planes 15. Each of the plurality of virtual planes 15 is a plane facing a surface 30a of the GaN wafer 30 in the GaN wafer 30, and is set to be arranged in a direction in which the surface 30a extends. In the present embodiment, each of the plurality of virtual planes 15 is a plane parallel to the surface 30a, and has, for example, a rectangular shape. The plurality of virtual planes 15 are set to be two-dimensionally arranged in a direction parallel to an orientation flat 31 of the GaN wafer 30 and a direction perpendicular to the orientation flat 31. In the GaN wafer 30, a plurality of peripheral edge regions 16 are set to surround the plurality of virtual planes 15, respectively. That is, each of the plurality of virtual planes 15 does not reach a side surface 30b of the GaN wafer 30. As an example, the width (in the present embodiment, half of the distance between the adjacent virtual planes 15) of the peripheral edge region 16 corresponding to each of the plurality of virtual planes 15 is equal to or more than 30 μm.

Figure 26:
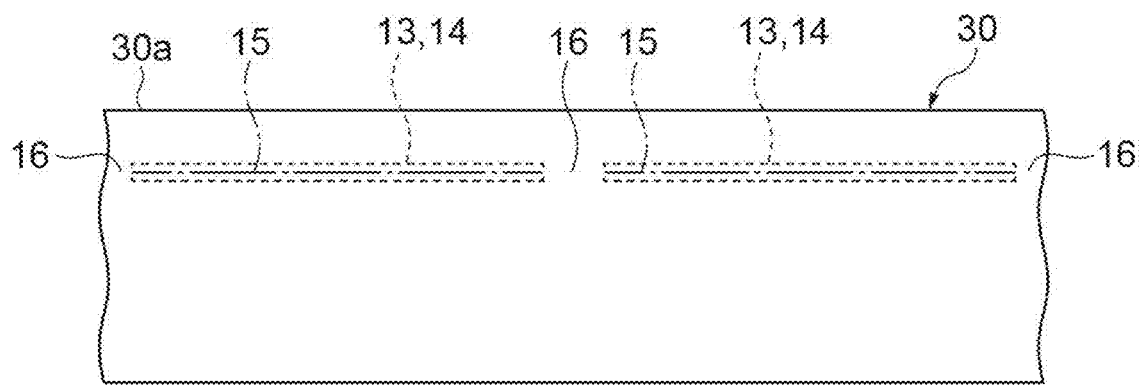
FIG. 26 is a side view illustrating a portion of the GaN wafer in one step of the laser processing method and the semiconductor member manufacturing method in the second embodiment.

The plurality of modified spots 13 are formed along each of the plurality of virtual planes 15 in a similar manner to the first step and the second step of the laser processing method and the semiconductor member manufacturing method in the first embodiment. Thus, in the GaN wafer 30, as illustrated in FIG. 26, a plurality of modified spots 13 (that is, modified spots 13a, 13b, 13c, and 13d) and a plurality of fractures 14 (that is, fractures 14a, 14b, 14c, and 14d) are formed along each of the plurality of virtual planes 15. In FIG. 26, a range in which the plurality of modified spots 13 and the plurality of fractures 14 are formed is indicated by a broken line.

Figure 27:
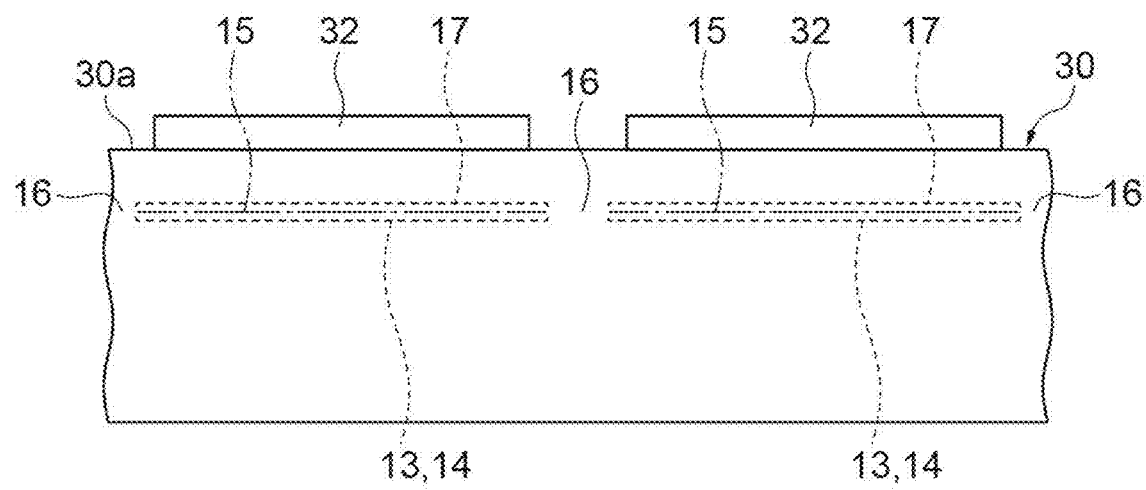
FIG. 27 is a side view illustrating the portion of the GaN wafer in one step of the laser processing method and the semiconductor member manufacturing method in the second embodiment.

Then, as illustrated in FIG. 27, a semiconductor manufacturing device forms a plurality of functional elements 32 on the surface 30a of the GaN wafer 30. Each of the plurality of functional elements 32 is formed so that one functional element 32 is included in one virtual plane 15 when viewed from a thickness direction of the GaN wafer 30. The functional element 32 is, for example, a light receiving element such as a photodiode, a light emitting element such as a laser diode, a circuit element such as a memory, or the like.

In the present embodiment, when the plurality of functional elements 32 are formed on the surface 30a, the semiconductor manufacturing device functions as a heating device. That is, when the plurality of functional elements 32 are formed on the surface 30a, the semiconductor manufacturing device heats the GaN wafer 30, and thus the plurality of fractures 14 respectively extending from the plurality of modified spots 13 are connected to each other in each of the plurality of virtual planes 15. In this manner, a fracture 17 (that is, fracture 17 crossing over the virtual plane 15) is formed in each of the plurality of virtual planes 15. In FIG. 27, the plurality of modified spots 13 and the plurality of fractures 14, and a range in which the fracture 17 is formed are indicated by broken lines. A heating device different from the semiconductor manufacturing device may be used. In addition, a certain force may be caused to act on the GaN wafer 30 by a method other than heating, and thereby the plurality of fractures 14 may be connected to each other to form the fracture 17. In addition, by forming the plurality of modified spots 13 along the virtual plane 15, the plurality of fractures 14 may be connected to each other to form the fracture 17.

Here, in the GaN wafer 30, a nitrogen gas is generated in the plurality of fractures 14 respectively extending from the plurality of modified spots 13. Therefore, by heating the GaN ingot 20 to expand the nitrogen gas, the fracture 17 can be formed by using the pressure of the nitrogen gas. In addition, the peripheral edge region 16 prevents development of the plurality of fractures 14 to the outside (for example, adjacent virtual plane 15, side surface 30b of the GaN wafer 30) of the virtual plane 15 surrounded by the peripheral edge region 16. Thus, it is possible to suppress escape of the nitrogen gas generated in the plurality of fractures 14 to the outside of the virtual plane 15. That is, the peripheral edge region 16 is a non-modified region that does not include the modified spot 13, and is a region that prevents development of the plurality of fractures 14 to the outside of the virtual plane 15 surrounded by the peripheral edge region 16 when the fracture 17 is formed in the virtual plane 15 surrounded by the peripheral edge region 16. Therefore, the width of the peripheral edge region 16 is preferably equal to or more than 30 µm.

Figure 28:
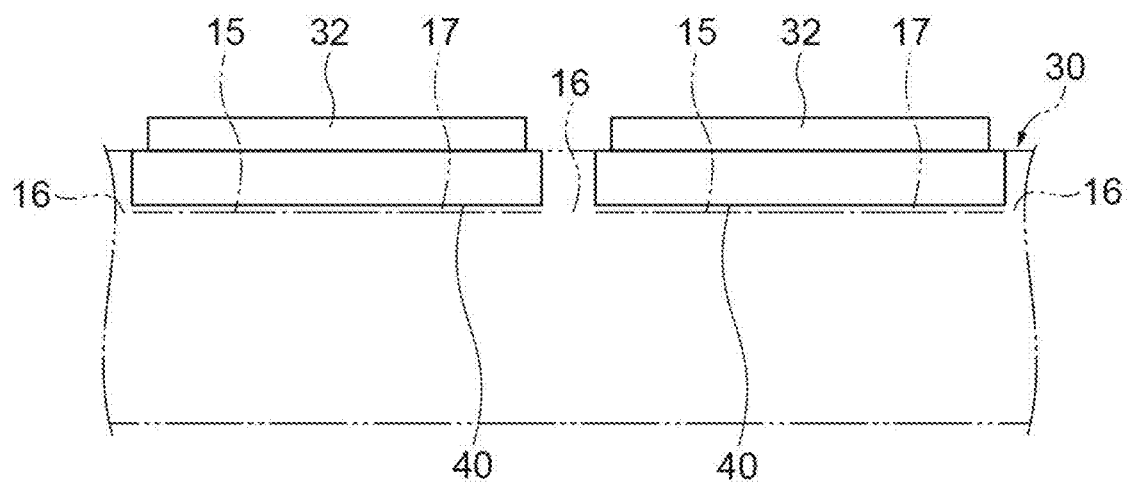
FIG. 28 is a side view illustrating a semiconductor device in one step of the laser processing method and the semiconductor member manufacturing method in the second embodiment.

Then, the laser processing apparatus cuts the GaN wafer 30 for each functional element 32, and the grinding device grinds a portion corresponding to each of the plurality of virtual planes 15. In this manner, as illustrated in FIG. 28, a plurality of semiconductor devices 40 are acquired from the GaN wafer 30 by using each of the plurality of fractures 17 as a boundary (third step). In this manner, the GaN wafer 30 is cut along each of the plurality of virtual planes 15. In this step, the GaN wafer 30 may be cut for each functional element 32 by machining (for example, blade dicing) other than laser processing.

Among the above steps, steps up to the step of forming the plurality of modified spots 13 along each of the plurality of virtual planes 15 correspond to the laser processing method in the second embodiment. Among the above steps, steps up to the step of acquiring the plurality of semiconductor devices 40 from the GaN wafer 30 by using each of the plurality of fractures 17 as a boundary correspond to the semiconductor member manufacturing method in the second embodiment.

As described above, according to the laser processing method in the second embodiment, similarly to the laser processing method in the first embodiment, it is possible to form the plurality of modified spots 13 along each of the plurality of virtual planes 15 with high precision. As a result, it is possible to form the fracture 17 along each of the plurality of virtual planes 15 with high precision. Therefore, according to the laser processing method in the second embodiment, it is possible to acquire a plurality of suitable semiconductor devices 40 by acquiring a plurality of semiconductor devices 40 from the GaN wafer 30 by using each of the plurality of fractures 17 as a boundary. Further, it is possible to reuse the GaN wafer 30 after the plurality of semiconductor devices 40 are cut out.

Similarly, according to the laser processing apparatus 1 that performs the laser processing method in the second embodiment, it is possible to form the fracture 17 along each of the plurality of virtual planes 15 with high precision. Thus, it is possible to acquire a plurality of suitable semiconductor devices 40.

In addition, in the laser processing method in the second embodiment, the plurality of modified spots 13a are formed so that the plurality of fractures 14a respectively extending from the plurality of modified spots 13a are not connected to each other. Thus, it is possible to form the plurality of modified spots 13b along the virtual plane 15 with higher precision.

In addition, in the laser processing method in the second embodiment, the plurality of rows of modified spots 13a are formed by moving the converging point C of the laser light L pulse-oscillated along the virtual plane 15. Then, the plurality of rows of modified spots 13b are formed by moving the converging point C of the laser light L pulse-oscillated along the virtual plane 15 between the rows of the plurality of rows of modified spots 13a. Thus, it is possible to reliably prevent overlapping of the plurality of modified spots 13b with the plurality of modified spots 13a and the plurality of fractures 14a, and to form the plurality of modified spots 13b along the virtual plane 15 with higher precision.

In particular, in the laser processing method in the second embodiment, if gallium nitride contained in the material of the GaN wafer 30 is decomposed by irradiation with the laser light L, gallium is deposited on the plurality of fractures 14a respectively extending from the plurality of modified spots 13a, and the laser light L is easily absorbed by the gallium. Therefore, forming the plurality of modified spots 13b so as not to overlap the fractures 14a is effective in forming the plurality of modified spots 13b along the virtual plane 15 with high precision.

In the laser processing method in the second embodiment, if gallium nitride contained in the material of the GaN wafer 30 is decomposed by irradiation with the laser light L, a nitrogen gas is generated in the plurality of fractures 14. Therefore, it is possible to easily form the fracture 17 by using pressure of the nitrogen gas.

Further, according to the semiconductor member manufacturing method in the second embodiment, with the step included in the laser processing method in the second embodiment, it is possible to form the fracture 17 along each of the plurality of virtual planes 15 with high precision. Thus, it is possible to acquire a plurality of suitable semiconductor devices 40.

In addition, in the semiconductor member manufacturing method in the second embodiment, the plurality of virtual planes 15 are set to be arranged in a direction in which the surface 30a of the GaN wafer 30 extends. Accordingly, it is possible to acquire a plurality of semiconductor devices 40 from one GaN wafer 30.

[Modification Examples]

The present disclosure is not limited to the above embodiments. For example, various numerical values related to the laser light L are not limited to those described above. In order to suppress extension of the fracture 14 from the modified spot 13 to the incident side and the opposite side of the laser light L, it is preferable that the pulse energy of the laser light L be 0.1 µJ to 1 µJ and the pulse width of the laser light L be 200 fs to 1 ns.

In addition, the semiconductor object to be processed by the laser processing method and the semiconductor member manufacturing method according to one aspect of the present disclosure is not limited to the GaN ingot 20 in the first embodiment and the GaN wafer 30 in the second embodiment. The semiconductor member manufactured by the semiconductor member manufacturing method according to one aspect of the present disclosure is not limited to the GaN wafer 30 in the first embodiment and the semiconductor device 40 in the second embodiment. One virtual plane may be set for one semiconductor object.

As an example, the material of the semiconductor object may be SiC. Also in this case, according to the laser processing method and the semiconductor member manufacturing method in one aspect of the present disclosure, as described below, it is possible to form a fracture crossing over a virtual plane, along the virtual plane with high precision.

(a) and (b) of FIG. 29 show images (images in side view) of a fracture of a SiC wafer formed by the laser processing method and the semiconductor member manufacturing method in a comparative example. (b) of FIG. 29 shows an enlarged image in a rectangular frame in (a) of FIG. 29. In this comparative example, a plurality of modified spots are formed along a virtual plane in a manner that laser light having a wavelength of 532 nm enters into a SiC wafer from the surface of the SiC wafer, and six converging points arranged in the Y direction are relatively moved on the virtual plane along the X direction. At this time, the distance between the converging points C adjacent to each other in the Y direction was set to 2 µm, the pulse pitch of the laser light was set to 15 µm, and the pulse energy of the laser light was set to 4 µJ. In this case, as illustrated in (a) and (b) of FIG. 29, a fracture extending in a direction inclined from the virtual plane by 4° to 5° is formed.

Figure 30:
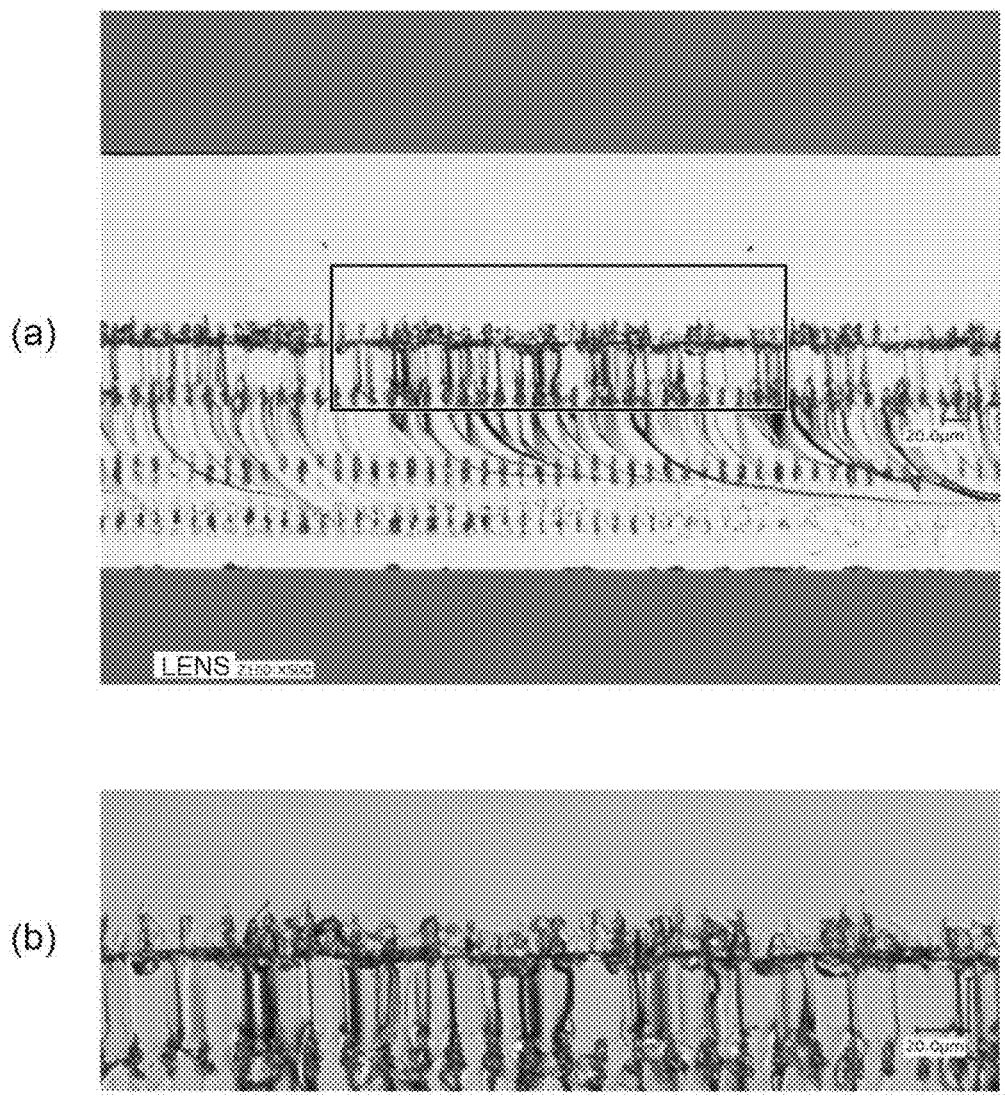
FIG. 30 shows an image of a fracture of a SiC wafer formed by a laser processing method and a semiconductor member manufacturing method in an example.
Figure 31:
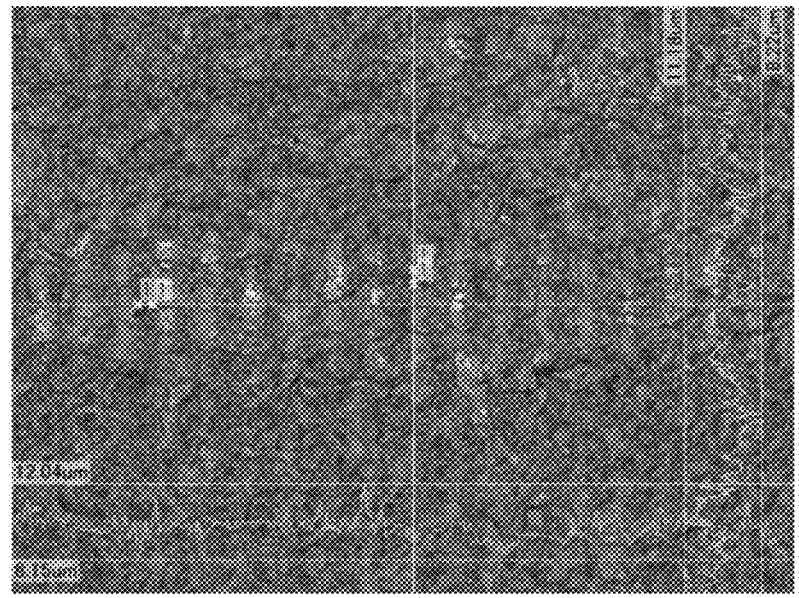
FIG. 31 shows an image of a peeling surface of the SiC wafer formed by the laser processing method and the semiconductor member manufacturing method in the example.
Figure 32:
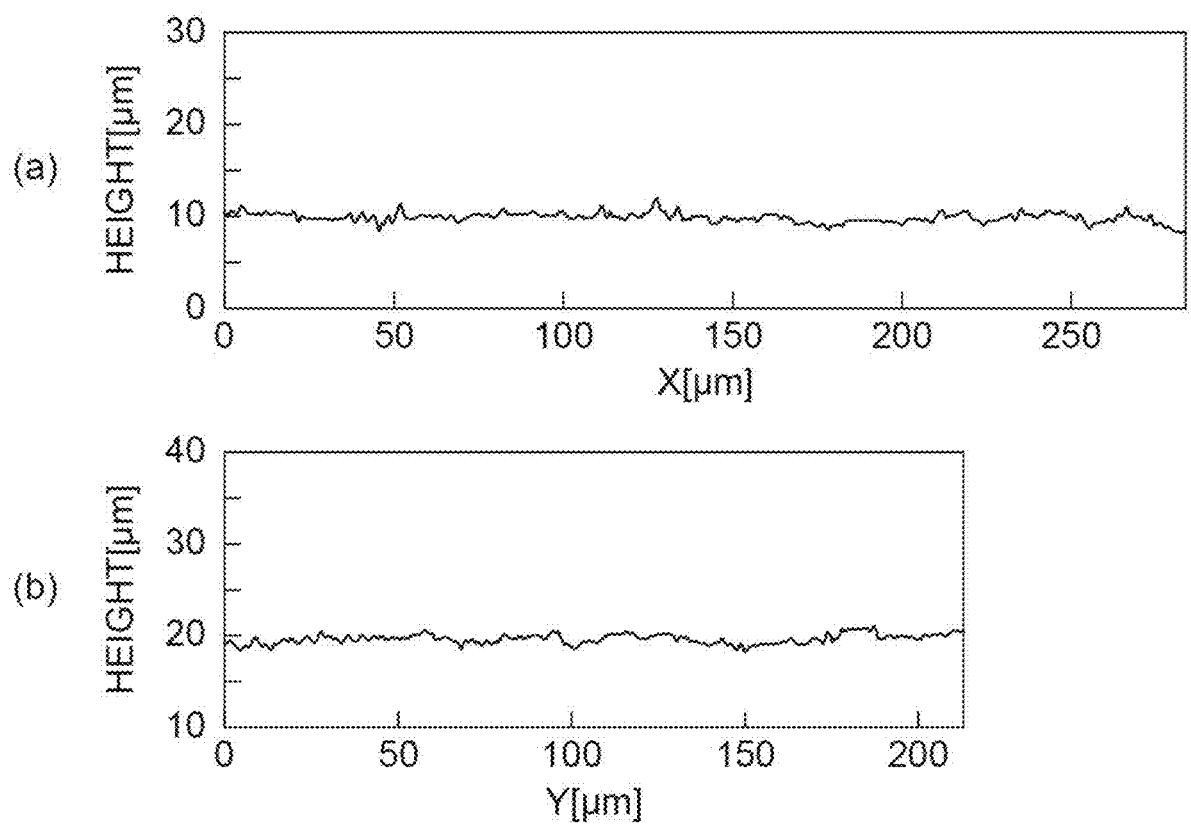
FIG. 32 shows a height profile of the peeling surface illustrated in FIG. 31.

(a) and (b) of FIG. 30 show images (images in side view) of a fracture of a SiC wafer formed by the laser processing method and the semiconductor member manufacturing method in an example. (b) of FIG. 30 shows an enlarged image in a rectangular frame in (a) of FIG. 30. In this example, a plurality of modified spots were formed along a virtual plane in a similar manner to the first step and the second step of the laser processing method and the semiconductor member manufacturing method in the first embodiment, in which laser light having a wavelength of 532 nm entered into a SiC wafer from the surface of the SiC wafer. When a plurality of modified spots respectively corresponding to the plurality of modified spots 13a, 13b, 13c, and 13d were formed, the distance between the converging points C adjacent to each other in the Y direction was set to 8 µm, the pulse pitch of the laser light L was set to 15 µm, and the pulse energy of the laser light L was set to 4 µJ. In this case, as illustrated in (a) and (b) of FIG. 30, forming a fracture extending in a direction inclined from the virtual plane by 4° to 5° is suppressed. FIG. 31 shows an image of a peeling surface of a SiC wafer formed by a laser processing method and semiconductor member manufacturing method in an example. (a) and (b) of FIG. 32 show height profiles of the peeling surface illustrated in FIG. 31. In this case, the unevenness appearing on the peeling surface of the SiC wafer is suppressed up to about 2 µm.

From the above experimental results, it has been understood that, even when the material of the semiconductor object is SiC, according to the laser processing method and the semiconductor member manufacturing method in one aspect of the present disclosure, a fracture crossing over the virtual plane is formed along virtual plane with high precision. The SiC wafer used in the comparative example and the example described above is a 4H-SiC wafer having an off angle of 4±0.5°. A direction in which the converging point of the laser light is moved is an in-axis direction.

Figure 33:
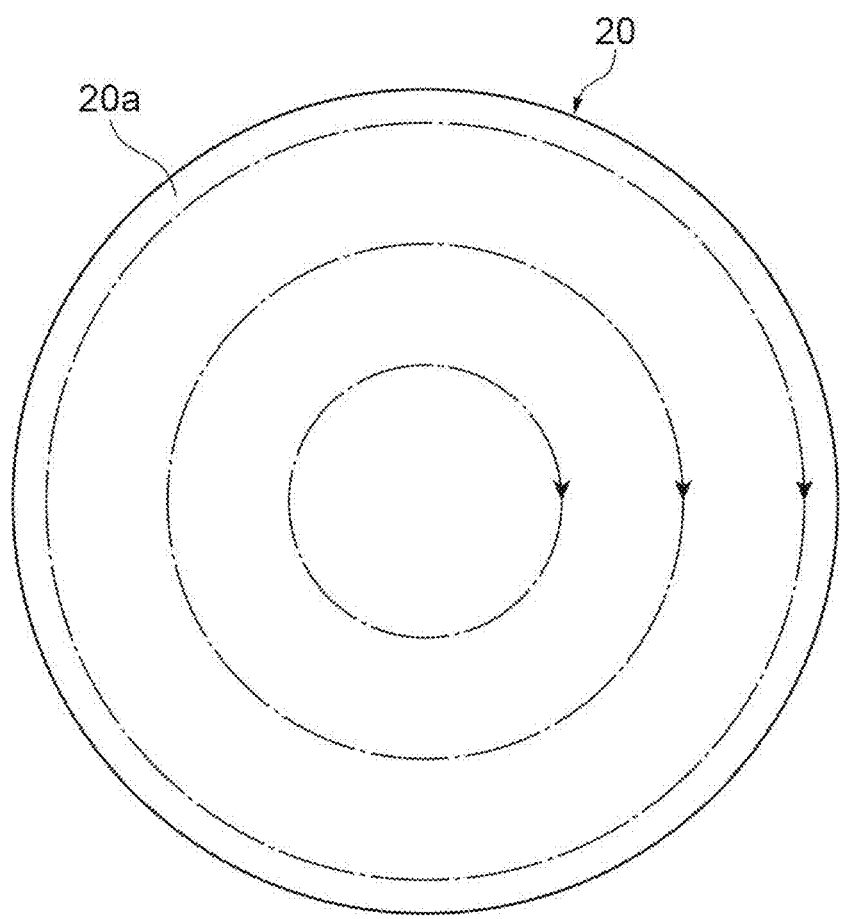
FIG. 33 is a plan view illustrating a GaN ingot in one step of a laser processing method and a semiconductor member manufacturing method in a modification example.
Figure 34:
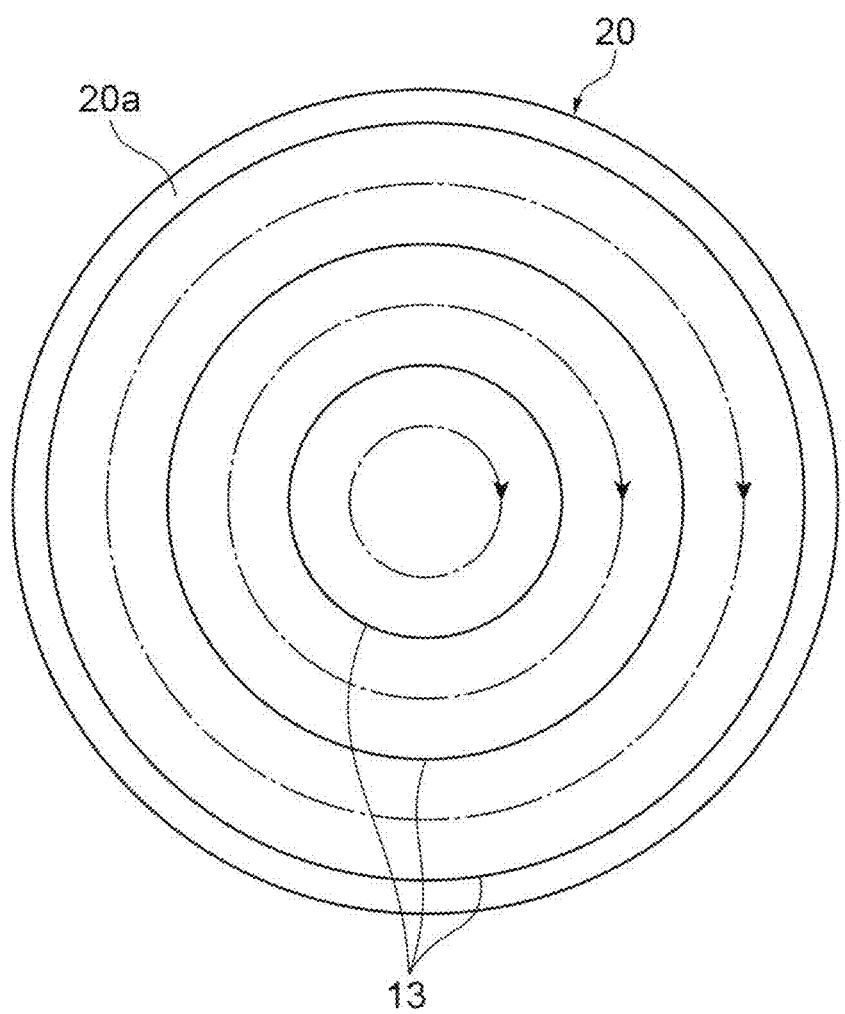
FIG. 34 is a plan view illustrating the GaN ingot in one step of the laser processing method and the semiconductor member manufacturing method in the modification example.

In addition, the method of forming the plurality of modified spots 13a, 13b, 13c, and 13d is not limited to the above description. The plurality of modified spots 13a may be formed so that the plurality of fractures 14a respectively extending from the plurality of modified spots 13a are connected to each other. The plurality of modified spots 13b may be formed so as not to overlap the plurality of modified spots 13a. Even though the plurality of modified spots 13b overlap the plurality of fractures 14a respectively extending from the plurality of modified spots 13a, if the plurality of modified spots 13b do not overlap the plurality of modified spots 13a, the plurality of modified spots 13a and 13b are formed along the virtual plane 15 with high precision. The plurality of modified spots 13c and 13d may be formed in any method, and the plurality of modified spots 13c and 13d may not be formed. As illustrated in FIG. 33, for example, a plurality of rows of modified spots 13 are formed, for example, by rotating the GaN ingot 20 to relatively rotate a plurality of converging points arranged in a radial direction (arrow indicated by a dashed-dotted line). Further, as illustrated in FIG. 34, in a state where each of the plurality of converging points is located between the rows of the plurality of rows of modified spots 13, the plurality of rows of modified spots 13 may be formed by relatively rotating the plurality of converging points arranged in the radial direction (arrow indicated by a dashed-dotted line).

Further, in the laser processing method and the semiconductor member manufacturing method in the first embodiment, the plurality of modified spots 13 may be sequentially formed for each of the plurality of virtual planes 15 from the opposite side of the surface 20a. In addition, in the laser processing method and the semiconductor member manufacturing method in the first embodiment, the plurality of modified spots 13 may be formed along one or the plurality of virtual planes 15 on the surface 20a side. After one or a plurality of GaN wafers 30 are cut out, the surface 20a of the GaN ingot 20 may be ground, and then the plurality of modified spots 13 may be formed again along one or the plurality of virtual planes 15 on the surface 20a side.

In the laser processing method and the semiconductor member manufacturing method in the first embodiment and the second embodiment, the peripheral edge region 16 may not be formed. When the peripheral edge region 16 is not formed in the laser processing method and the semiconductor member manufacturing method in the first embodiment, it is possible to acquire a plurality of GaN wafers 30 by forming a plurality of modified spots 13 along each of the plurality of virtual planes 15, and then etching the GaN ingot 20, for example.

The laser processing apparatus 1 is not limited to a device having the above-described configuration. For example, the laser processing apparatus 1 may not include the spatial light modulator 4.

Various materials and shapes can be applied to each configuration in the above-described embodiment without being limited to the above-described materials and shapes. Further, the configurations in the embodiment or the modification examples described above can be randomly applied to the configuration in another embodiment or modification examples.

REFERENCE SIGNS LIST 1 laser processing apparatus
2 stage
4 spatial light modulator (laser irradiation unit)
5 converging lens (laser irradiation unit)
13 modified spot
13a modified spot (first modified spot)
13b modified spot (second modified spot)
13c, 13d modified spot (third modified spot)
14, 14a, 14b, 14c, 14d fracture
15 virtual plane
17 fracture crossing over virtual plane
20 GaN ingot (semiconductor ingot, semiconductor object)
20a surface
30 GaN wafer (semiconductor wafer, semiconductor member, semiconductor object)
30a surface
40 semiconductor device (semiconductor member)
L laser light

The invention claimed is:

1. A laser processing method for cutting a semiconductor object along a virtual plane facing a surface of the semiconductor object in the semiconductor object, the method comprising:
   a first step of forming a plurality of first modified spots along the virtual plane by causing laser light to enter into the semiconductor object from the surface, and forming a plurality of rows of first modified spots; and
   a second step of forming a plurality of second modified spots along the virtual plane so as not to overlap the plurality of first modified spots, by causing laser light to enter into the semiconductor object from the surface, and forming a plurality of rows of second modified spots each positioned between the rows of the plurality of rows of first modified spots,
   wherein, in the first step, the laser light is converged at a plurality of first converging points, and the plurality of first converging points are relatively moved along a direction intersecting a direction in which the plurality of first converging points are arranged, and
   in the second step, the laser light is converged at a plurality of second converging points each positioned between the rows of the plurality of rows of first modified spots, and the plurality of second converging points are relatively moved along a direction intersecting a direction in which the plurality of second converging points are arranged.

2. The laser processing method according to claim 1, wherein in the second step, the plurality of second modified spots are formed along the virtual plane so as not to overlap a plurality of fractures respectively extending from the plurality of first modified spots.

3. The laser processing method according to claim 1, wherein in the second step, after the plurality of second modified spots are formed, a plurality of third modified spots are formed along the virtual plane so as not to overlap the plurality of first modified spots and the plurality of second modified spots, by causing laser light to enter into the semiconductor object from the surface.

4. The laser processing method according to claim 1, wherein in the first step, the plurality of first modified spots are formed so that a plurality of fractures respectively extending from the plurality of first modified spots are not connected to each other.

5. The laser processing method according to claim 1, wherein
   in the first step, a plurality of rows of first modified spots are formed as the plurality of first modified spots by moving a converging point of the laser light pulse-oscillated along the virtual plane, and
   in the second step, a plurality of rows of second modified spots are formed as the plurality of second modified spots by moving a converging point of the laser light pulse-oscillated along the virtual plane between the rows of the plurality of rows of first modified spots.

6. The laser processing method according to claim 1, wherein a material of the semiconductor object contains gallium.

7. The laser processing method according to claim 6, wherein the material of the semiconductor object contains gallium nitride.

8. A semiconductor member manufacturing method comprising:
   the first step and the second step included in the laser processing method according to claim 1; and
   a third step of acquiring a semiconductor member from the semiconductor object by using a fracture crossing over the virtual plane as a boundary.

9. The semiconductor member manufacturing method according to claim 8, wherein a plurality of the virtual planes are set to be arranged in a direction facing the surface.

10. The semiconductor member manufacturing method according to claim 9, wherein
    the semiconductor object is a semiconductor ingot, and
    the semiconductor member is a semiconductor wafer.

11. The semiconductor member manufacturing method according to claim 8, wherein a plurality of the virtual planes are set to be arranged in a direction in which the surface extends.

12. The semiconductor member manufacturing method according to claim 11, wherein
    the semiconductor object is a semiconductor wafer, and
    the semiconductor member is a semiconductor device.

* * * * *